(12) United States Patent
Sung et al.

(10) Patent No.: US 11,985,863 B2
(45) Date of Patent: May 14, 2024

(54) DISPLAY DEVICE AND METHOD OF MANUFACTURING THE SAME

(71) Applicant: Samsung Display Co., LTD., Yongin-si (KR)

(72) Inventors: Woo Yong Sung, Seoul (KR); Chan Ho Moon, Suwon-si (KR); Jung Han Seo, Hwaseong-si (KR); Seung Yong Song, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 272 days.

(21) Appl. No.: 17/470,346

(22) Filed: Sep. 9, 2021

(65) Prior Publication Data

US 2022/0149126 A1 May 12, 2022

(30) Foreign Application Priority Data

Nov. 9, 2020 (KR) .................. 10-2020-0148323

(51) Int. Cl.
*H10K 59/122* (2023.01)
*H10K 50/813* (2023.01)
(Continued)

(52) U.S. Cl.
CPC ......... *H10K 59/122* (2023.02); *H10K 50/813* (2023.02); *H10K 50/818* (2023.02);
(Continued)

(58) Field of Classification Search
None
See application file for complete search history.

(56) References Cited

U.S. PATENT DOCUMENTS

| 8,395,569 B2 | 3/2013 | Min et al. |
| 8,415,872 B2 | 4/2013 | Choi et al. |
| (Continued) | | |

FOREIGN PATENT DOCUMENTS

| CN | 113284929 A * | 8/2021 | ............... G09G 3/20 |
| KR | 10-2014-0016474 | 2/2014 | |
| | (Continued) | | |

OTHER PUBLICATIONS

Partial European search report for European Patent Application or Patent No. 21206798.7 dated May 3, 2022.

*Primary Examiner* — Michael Lebentritt
(74) *Attorney, Agent, or Firm* — KILE PARK REED & HOUTTEMAN PLLC

(57) ABSTRACT

A display device includes a first electrode disposed on a substrate, a pixel defining layer exposing at least a part of the first electrode and disposed on the substrate, a light emitting layer disposed on the first electrode, a second electrode disposed on the light emitting layer, and an encapsulation layer disposed on the second electrode, wherein the pixel defining layer includes an overlapping area overlapping the first electrode and a non-overlapping area not overlapping the first electrode, the overlapping area includes a first overlapping area spaced apart from the first electrode and facing the first electrode, and the encapsulation layer is at least partially disposed in a space between the first electrode and the pixel defining layer in the first overlapping area.

26 Claims, 18 Drawing Sheets

(51) Int. Cl.
    *H10K 50/818* (2023.01)
    *H10K 50/844* (2023.01)
    *H10K 59/124* (2023.01)
    *H10K 71/00* (2023.01)
    *H10K 102/10* (2023.01)

(52) U.S. Cl.
    CPC ......... *H10K 50/844* (2023.02); *H10K 59/124* (2023.02); *H10K 71/00* (2023.02); *H10K 2102/103* (2023.02)

(56) References Cited

U.S. PATENT DOCUMENTS

| | | | |
|---|---|---|---|
| 2019/0165063 A1 | 5/2019 | Lee et al. | |
| 2019/0198812 A1 | 6/2019 | Lee et al. | |
| 2021/0296404 A1* | 9/2021 | You | G06F 3/0412 |
| 2023/0180537 A1* | 6/2023 | Jung | H10K 59/123 |
| | | | 257/40 |

FOREIGN PATENT DOCUMENTS

| | | |
|---|---|---|
| KR | 10-2016-0056705 | 5/2016 |
| KR | 10-1930030 | 12/2018 |
| KR | 10-2019-0069166 | 6/2019 |
| KR | 10-2019-0072700 | 6/2019 |
| KR | 10-2019-0093830 | 8/2019 |
| KR | 10-2019-0122073 | 10/2019 |

\* cited by examiner

DISPLAY DEVICE AND METHOD OF MANUFACTURING THE SAME

CROSS-REFERENCE TO RELATED APPLICATION(S)

This application claims priority to and benefits of Korean Patent Application No. 10-2020-0148323 under 35 U.S.C. § 119 filed on Nov. 9, 2020 in the Korean Intellectual Property Office, the entire contents of which are incorporated herein by reference.

BACKGROUND

1. Technical Field

The disclosure relates to a display device and a method of manufacturing the same.

2. Description of the Related Art

With the development of the information society, requirements for display devices for displaying images have increased in various forms. For example, display devices are applied to various electronic appliances such as smart phones, digital cameras, notebook computers, navigators, and smart televisions.

Examples of display devices include light receiving display devices such as a liquid crystal display device and a field emission display device, and light emitting display devices such as an organic light emitting display device including an organic light emitting element, an inorganic light emitting display device including an inorganic light emitting element such as an inorganic semiconductor, and a micro light emitting display device including a micro light emitting element.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device including a thin film encapsulation layer having improved adhesion force.

However, aspects of the disclosure are not restricted to the ones set forth herein. The above and other aspects of the disclosure will become more apparent to one of ordinary skill in the art to which the disclosure pertains by referencing the detailed description of the disclosure given below.

An embodiment of a display device may include a first electrode disposed on a substrate; a pixel defining layer exposing at least a part of the first electrode and disposed on the substrate; a light emitting layer disposed on the first electrode; a second electrode disposed on the light emitting layer; and an encapsulation layer disposed on the second electrode, wherein the pixel defining layer may include an overlapping area overlapping the first electrode and a non-overlapping area not overlapping the first electrode, the overlapping area may include a first overlapping area spaced apart from the first electrode and facing the first electrode, and the encapsulation layer may be at least partially disposed in a space between the first electrode and the pixel defining layer in the first overlapping area.

The overlapping area may further include a second overlapping area contacting the first electrode.

The first overlapping area and the second overlapping area may be alternately disposed near an edge of the first electrode in a plan view.

The first overlapping area and the second overlapping area may be integral with each other, and the overlapping area and the non-overlapping area may be integral with each other.

In at least a cross section passing through the first overlapping area, the second electrode may include a first portion disposed on the pixel defining layer; and a second portion disposed on the first electrode, and the first portion may be discontinuously spaced apart from the second portion.

The encapsulation layer may include a first encapsulation film and a second encapsulation film disposed on the first encapsulation film, and in at least a cross section passing through the first overlapping area, the first encapsulation film may be continuously disposed along surfaces of the pixel defining layer and the first electrode exposed to the space between the first electrode and the pixel defining layer in the first overlapping area.

In the cross section passing through the first overlapping area, the first encapsulation film disposed on the surface of the pixel defining layer and the first encapsulation film disposed on the surface of the first electrode may be spaced apart from each other and face each other, and the second encapsulation film may fill a space between the first encapsulation film disposed on the surface of the pixel defining layer and the first encapsulation film disposed on the surface of the first electrode.

The first encapsulation film may be an inorganic film, and the second encapsulation film may be an organic film.

The display device may further include a planarization layer disposed on the substrate and including the pixel defining layer and the first electrode, wherein the pixel defining layer and the planarization layer may be spaced apart from each other in a space located in the non-overlapping area at a side of the first overlapping area.

The encapsulation layer may be at least partially disposed in the space located in the non-overlapping area at the side of the first overlapping area.

The encapsulation layer may directly contact the planarization layer.

The encapsulation layer may have a peeling force in a range of about 20 gf/inch to about 40 gf/inch.

An upper surface of the first electrode may have a surface roughness in a range of more than about 1.98 nm and about 5 nm or less.

The surface roughness of the upper surface of the first electrode may be measured by atomic force microscopy.

The first electrode may include a first stacked conductive layer, a second stacked conductive layer, and a third stacked conductive layer, which may be sequentially stacked, the first stacked conductive layer and the third stacked conductive layer may include amorphous Indium-Tin-Oxide (ITO), the second stacked conductive layer may include silver (Ag), and the third stacked conductive layer may further include poly crystal Indium-Tin-Oxide (ITO).

An embodiment of a display device may include a first electrode disposed on a substrate; a pixel defining layer exposing the first electrode and including a base portion disposed on the substrate and surrounding the first electrode; and a spacing portion protruding toward the first electrode from the base portion and spaced apart from and facing the first electrode; a light emitting layer disposed on the first electrode; a second electrode disposed on the light emitting layer; and an encapsulation layer disposed on the second electrode, wherein the encapsulation layer may be at least partially disposed in the spacing portion between the first electrode and the pixel defining layer.

The spacing portion of the pixel defining layer may include a first spacing portion and a second spacing portion, the first spacing portion may be spaced apart from the first electrode in a thickness direction, and the second spacing portion may directly contact the first electrode.

The encapsulation layer may be disposed between the first spacing portion and the first electrode and may not be disposed between the second spacing portion and the first electrode in the thickness direction.

The thickness of the first spacing portion and thickness of the second spacing portion may be less than a thickness of the base portion.

An upper surface of the first spacing portion and an upper surface of the first base portion may be coplanar.

An embodiment of a method of manufacturing a display device, the method may include forming a first electrode on a substrate; forming a sacrificial pattern on the first electrode; forming a pixel defining layer on the sacrificial pattern; removing the sacrificial pattern; and forming an encapsulation layer on the pixel defining layer, wherein the pixel defining layer may include an overlapping area overlapping the first electrode and a non-overlapping area not overlapping the first electrode, the overlapping area may include a first overlapping area spaced apart from and facing the first electrode, and the encapsulation layer may be at least partially disposed in a space between the first electrode and the pixel defining layer in the first overlapping area.

The removing of the sacrificial pattern may be performed by wet etching.

The overlapping area may further include a second overlapping area contacting the first electrode.

A surface roughness of an upper surface of the first electrode may be measured by atomic force microscopy.

According to an embodiment, the adhesion force of a thin film encapsulation layer may be improved, and thus the reliability of a display device may be improved.

The effects of the disclosure are not limited by the foregoing, and other various effects are included herein.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
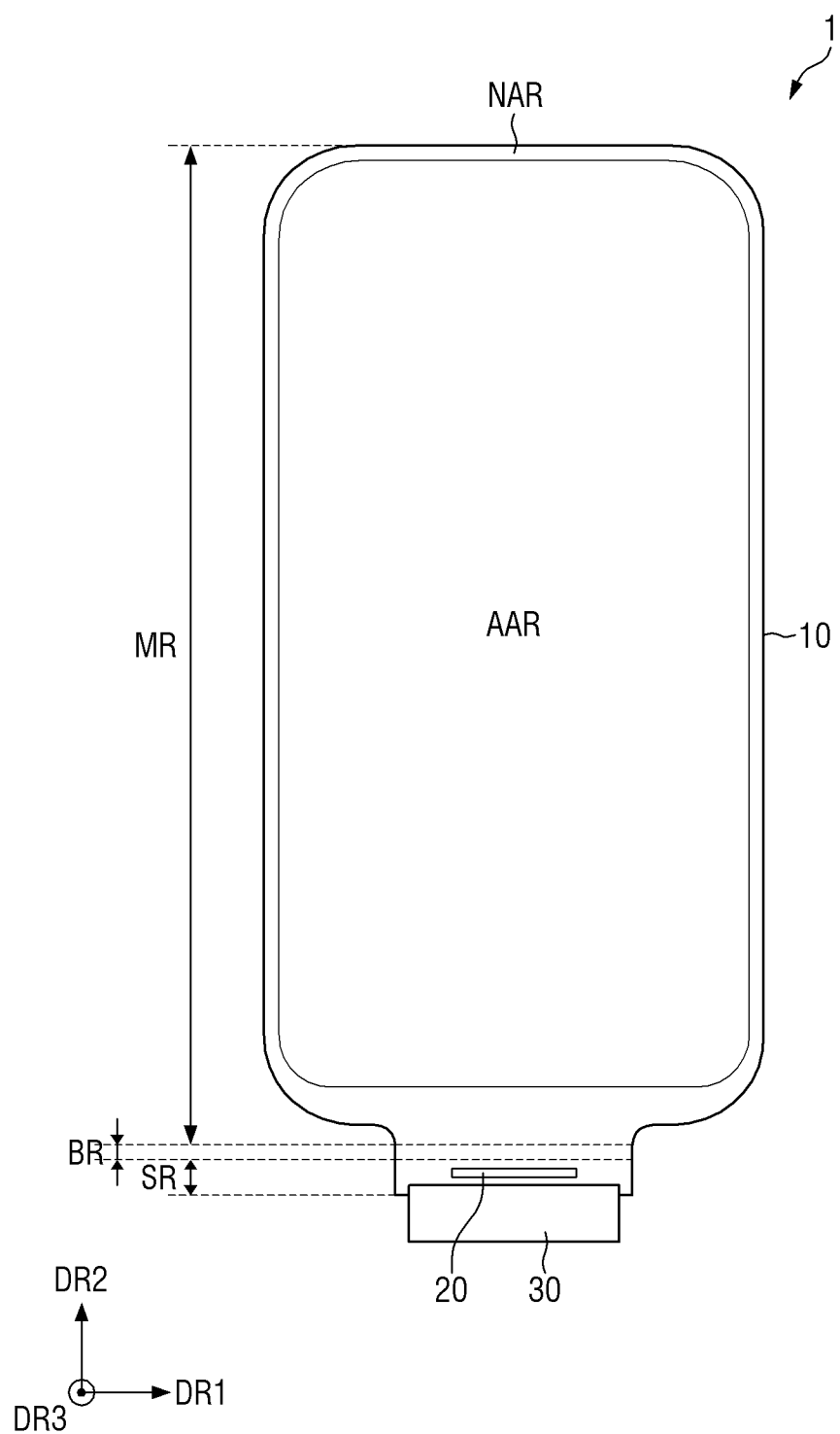
FIG. 1 is a schematic plan layout view of a display device according to an embodiment.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions is exaggerated for clarity.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Although the terms "first," "second," etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first category (or first set)," "second category (or second set)," etc., respectively.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described with reference to the attached drawings.

Figure 2:
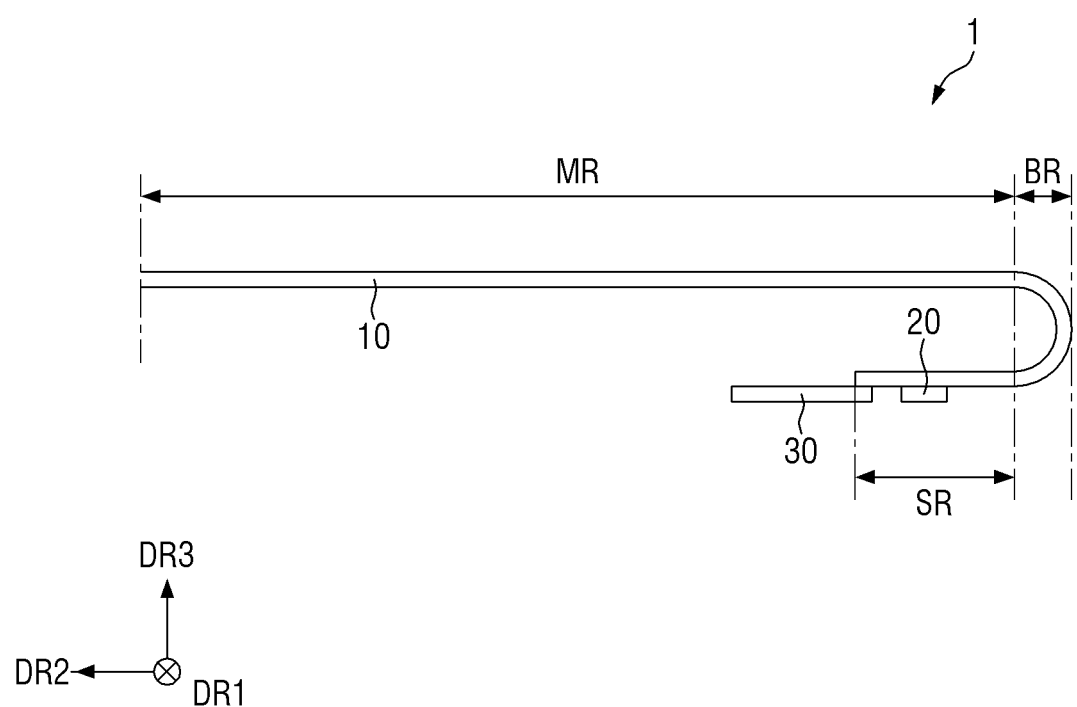
FIG. 2 is a schematic partial cross-sectional view of a display device according to an embodiment.

FIG. 1 is a schematic plan layout view of a display device according to an embodiment, and FIG. 2 is a schematic partial cross-sectional view of a display device according to an embodiment.

In embodiments, a first direction DR1 and a second direction DR2 may cross each other in different directions. In the plan view of FIG. 1, for convenience of description, the first direction DR1 which is a horizontal direction and the second direction DR2 which is a vertical direction, are defined. In the following embodiments, a side of the first direction DR1 refers to a right direction in the plan view, another side of the first direction DR1 refers to a left direction in the plan view, a side of the second direction DR2 refers to an upward direction in the plan view, and another side of the second direction DR2 refers to a downward direction in the plan view.

A third direction DR3 may intersect a plane on which the first direction DR1 and the second direction DR2 are defined, and may vertically intersect both the first direction DR1 and the second direction DR2. However, the directions mentioned in the embodiments should be understood to refer to relative directions, and the embodiments are not limited to the aforementioned directions.

Unless otherwise defined, in this specification, "upper," "upper surface," or "upper side" expressed on the basis of the third direction DR3 refers to a side of a display surface of a display panel 10, and "lower," "lower surface," or "lower side" expressed on the basis of the third direction DR3 refers to an opposite side of the display surface of the display panel 10.

Referring to FIGS. 1 and 2, a display device 1 may refer to all electronic devices that provide a display screen. For example, the display device 1 may be used in televisions, laptop computers, monitors, billboards, Internet of things (IoT) devices as well as portable electronic appliances such as mobile phones, smartphones, tablet personal computers (PCs), smartwatches, watchphones, mobile communication terminals, electronic notebooks, electronic books, portable multimedia players (PMPs), navigation systems, game consoles, and digital cameras.

The display device 1 may include an active area AAR and a non-active area NAR. In the display device 1, in case that a portion displaying an image is defined as a display area, a portion displaying no image is defined as a non-display area, and an area where a touch input is detected is defined as a touch area, the display area and the touch area may be included in the active area AAR. The display area and the touch area may overlap each other. For example, the active area AAR may be an area in which an image is displayed and a touch input is detected.

The shape of the active area AAR may be a rectangle or a rectangle having rounded corners. An illustrated shape of the active area AAR is a rectangle which has rounded corners and in which sides thereof in the second direction DR2 are greater than those thereof in the first direction DR1. However, the shape thereof is not limited thereto, and the active area AAR may have various shapes such as substantially a rectangle in which sides thereof in the first direction DR1 are longer or greater than those in the second direction DR2, substantially a square, substantially a polygon, substantially a circle, and substantially an ellipse.

The non-active area NAR may be disposed around the active area AAR. The non-active area NAR may be a bezel area. The non-active area NAR may surround or may be adjacent to all sides (four sides in FIG. 1) of the active area AAR. However, the disclosure is not limited thereto, and for example, the non-active area NAR may not be disposed near the upper side of the active area AAR or near the left and right sides thereof.

Signal lines or driving circuits for applying signals to the active area AAR (the display area or the touch area) may be arranged or disposed in the non-active area NAR. The non-active area NAR may include no display area. Moreover, the non-active area NAR may include no touch area. In an embodiment, the non-active area NAR may include a part of the touch area, and a sensor member such as a pressure sensor may be disposed in the part. In an embodiment, the active area AAR may be an area that is identical to the display area on which an image is displayed, and the non-active area NAR may be an area that is identical to the non-display area in which no image is displayed.

The display device 1 may include a display panel 10 that provides a display screen. Examples of the display panel 10 may include an organic light emitting display panel, a micro light-emitting diode (LED) display panel, a nano LED display panel, a quantum dot light emitting display panel, a liquid crystal display panel, a plasma display panel, a field emission display panel, an electrophoresis display panel, and an electrowetting display panel. Hereinafter, an organic light emitting display panel may be used as an example of the display panel 10, but the disclosure is not limited thereto, and other display panels may be used if the same technical idea is applicable thereto.

The display panel 10 may include pixels. The pixels may be arranged or disposed in a matrix direction. The shape of each pixel may be a substantially rectangular or a substantially square shape in a plan view, but is not limited thereto, and may be a substantially rhombic shape in which each side is inclined with respect to the second direction DR2 or the first direction DR1. Each pixel may include a light emitting area. Each light emitting area and the pixel may have a same shape or a similar shape, but may also have different shapes. For example, in case that the shape of a pixel is a substantially rectangular shape, the shape of the light emitting area of the pixel may have various shapes such as substantially a rectangle, substantially a rhombus, substantially a hexagon, substantially an octagon, and substantially a circle. Details of each pixel and each light emitting area will be described below.

The display device 1 may further include a touch member for detecting a touch input. The touch member may be provided as an additional panel or film distinct from the display panel 10 and attached onto the display panel 10, but may be provided in the form of a touch layer inside the display panel 10. In the following embodiments, the touch member may be provided or disposed inside the touch panel and included in the display panel 10, as an example, but the disclosure is not limited thereto.

The display panel 10 may include a flexible substrate including a flexible polymer material such as polyimide. Therefore, the display panel 10 may be warped, bent, folded, or rolled.

The display panel 10 may include a bending area BR where the display panel 10 is bent. The display panel 10 may be divided into a main area MR located or disposed at a side of the bending area BR and a sub-area SR located or disposed at another side of the bending area BR with respect to the bending area BR.

The display area of the display panel 10 may be disposed in the main area MR. In an embodiment, in the main area MR, the peripheral edge portion of the display area, the entire bending area BR, and the entire sub-area SR may be a non-display area. However, the disclosure is not limited thereto, and the bending area BR and/or the sub-area SR may also include a display area.

The main area MR may generally have a shape similar to the exterior of the display device 1 in a plan view. The main area MR may be a flat area located or disposed in a plane. However, the disclosure is not limited thereto, and, except for the edge (side), of the main area MR, connected to the bending area BR, at least one of the remaining edges thereof may be substantially curved to form a substantially curved surface or may be substantially bent in the vertical direction.

In case that at least one of the remaining edges of the main area MR except for the edge (side) thereof connected to the bending area BR may be substantially curved or substantially bent, the display areas may also be disposed at the edge. However, the disclosure is not limited thereto, and the substantially curved or substantially bent edge may be provided with a non-display area that displays no image, or with both the display area and the non-display area.

The bending area BR may be connected or may be extended to another side of the main area MR in the second direction DR2. For example, the bending area BR may be connected or extended through a lower short side of the main area MR. The width of the bending area BR may be smaller than that (the width of the short side) of the main area MR. Connection portions of the main area MR and the bending area BR may have a substantially L-shaped cut shape.

In the bending area BR, the display panel 10 may be bent with a curvature in the thickness direction, which is a downward direction, for example, in a direction opposite to a display surface. The bending area BR may have a radius of curvature, but is not limited thereto, and may have a different radius of curvature for each section. As the display panel 10 is bent in the bending area BR, the surface of the display panel 10 may be reversed. For example, a surface, of the display panel 10, facing upward may be changed to face outward through the bending area BR and face downward.

The sub-area SR may extend from the bending area BR. The sub-area SR may extend in a direction parallel to the main area MR after the bending is completed. The sub-area SR may overlap the main area MR in the thickness direction of the display panel 10. The width (the width in the first direction DR1) of the sub-area SR may be equal to that of the bending area BR, but the disclosure is not limited thereto.

A driving chip IC 20 may be disposed in the sub-area SR. The driving chip IC 20 may include an integrated circuit for driving the display panel 10. The integrated circuit may include an integrated circuit for a display and/or an integrated circuit for a touch part. The integrated circuit for a display and the integrated circuit for a touch part may be provided as separate chips, or may be integrated into a chip.

A pad part 30 may be disposed at an end of the sub-area SR of the display panel 10. The pad part 30 may include display signal line pads and touch signal line pads. A driving substrate FPC (not illustrated) may be electrically connected to the pad part 30 provided or disposed at the end of the sub-area SR of the display panel 10. The driving substrate FPC (not illustrated) may be a flexible printed circuit board or a film.

Figure 3:
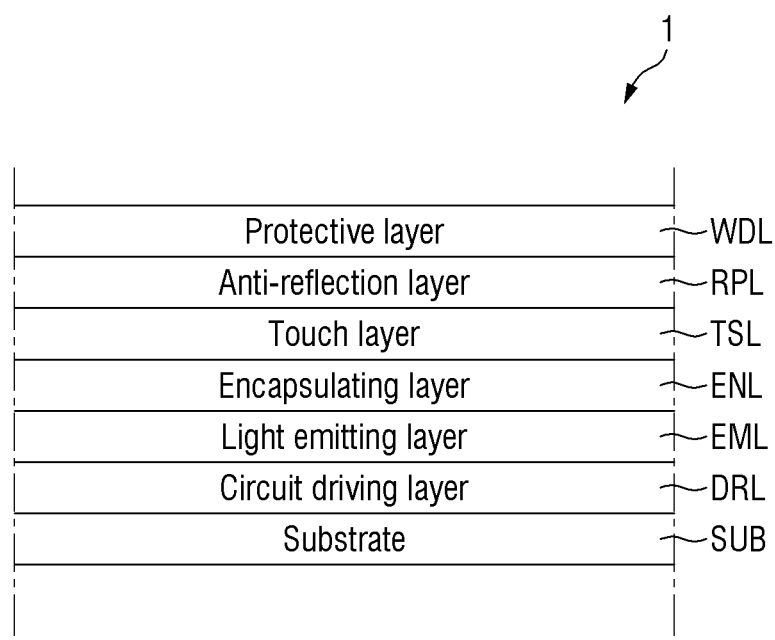
FIG. 3 is a schematic cross-sectional view illustrating a stacked structure of a display panel according to an embodiment.

FIG. 3 is a schematic cross-sectional view illustrating a stacked structure of a display panel according to an embodiment.

Referring to FIG. 3, the display panel 10 may include a substrate SUB, a circuit driving layer DRL, a light emitting layer EML, an encapsulation or encapsulating layer ENL, a touch layer TSL, an anti-reflection layer RPL, and a protective layer WDL, which may be sequentially stacked each other.

The substrate SUB may support components arranged or disposed thereon.

The circuit driving layer DRL disposed on a substrate SUB. The circuit driving layer DRL may include a circuit for driving a light emitting layer EML of a pixel. The circuit driving layer DRL may include thin film transistors.

The light emitting layer EML may be disposed on the circuit driving layer DRL. The light emitting layer EML may include an organic light emitting layer. The light emitting layer EML may emit light with various luminance in response to a driving signal transmitted from the circuit driving layer DRL.

The encapsulation or encapsulating layer ENL may be disposed on the light emitting layer EML. The encapsulation or encapsulating layer ENL may include an inorganic film or a stacked film of an inorganic film and an organic film. As another example, a glass film or an encapsulation film may be used as the encapsulation or encapsulating layer ENL.

The touch layer TSL may be disposed on the encapsulation or encapsulating layer ENL. The touch layer TSL may be a layer that recognizes a touch input, and may function as a touch member. The touch layer TSL may include sensing areas and sensing electrodes.

The anti-reflection layer RPL may be disposed on the touch layer TSL. The anti-reflection layer RPL may serve to reduce the reflection of external light. The anti-reflection layer RPL may be attached to the touch layer TSL in the form of a polarizing film. The anti-reflection layer RPL may polarize passing light, and the anti-reflection layer RPL may be attached to an upper portion of the touch layer TSL by an adhesive layer. The anti-reflection layer RPL in the form of a polarizing film may be omitted. The anti-reflection layer RPL may serve to reduce the reflection of external light. However, the disclosure is not limited thereto, and the anti-reflection layer RPL may be stacked in the form of a color filter layer inside the display panel 10. The anti-reflection layer RPL may include a color filter or the like that selectively transmits light of a specific or given wavelength.

The protective layer WDL may be disposed on the anti-reflection layer RPL. The protective layer WDL may include, for example, a window member. The protective layer WDL may be attached onto the anti-reflection layer RPL by an optically clear adhesive or the like within the spirit and the scope of the disclosure.

Although not shown in the drawings, the display device 1 may further include a light blocking pattern layer. The light blocking pattern layer may be disposed between the encapsulation or encapsulating layer ENL and the touch layer TSL, but the disclosure is not limited thereto. The light blocking pattern layer may serve to reduce the reflection of external light and improve the color of reflected light.

Hereinafter, a detailed stacked structure of the display panel 10 according to an embodiment will be described with reference to FIG. 4.

Figure 4:
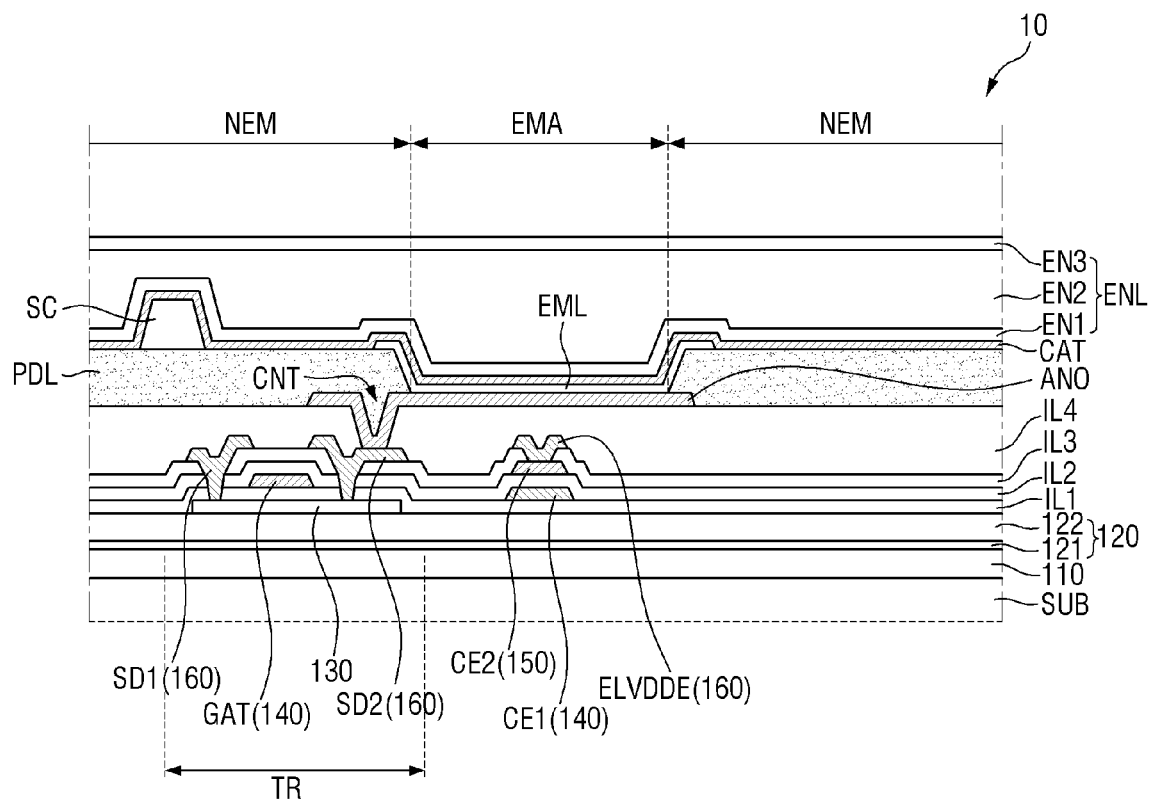
FIG. 4 is a schematic cross-sectional view of a display panel according to an embodiment.

FIG. 4 is a schematic cross-sectional view of a display panel according to an embodiment.

Referring to FIG. 4, the display panel 10 according to an embodiment may include pixels, and each pixel may include at least one thin film transistor TR. The display panel 10 may include a substrate SUB, a barrier layer 110, a buffer layer 120, a semiconductor layer 130, a first insulating layer IL1, a first gate conductive layer 140, a second insulating layer IL2, a second gate conductive layer 150, a third insulating layer IL3, a data conductive layer 160, a fourth insulating layer IL4, an anode electrode ANO, a pixel defining layer PDL including an opening exposing the anode electrode ANO, a light emitting layer EML disposed in the opening of the pixel defining layer PDL, a cathode electrode CAT disposed on the light emitting layer EML and the pixel defining layer PDL, and an encapsulation or encapsulating layer ENL disposed on the cathode electrode CAT. Each of the above-described layers may be formed as a single layer, but may be formed as a stacked layer including layers. For example, the buffer layer 120 may include at least two layers, 121 and 122. Another layer may be further disposed between the respective layers.

The substrate SUB may support each of the layers disposed thereon. The substrate SUB may be made of an insulating material such as a polymer resin, or of an inorganic material such as glass or quartz. However, the disclosure is not limited thereto, and the substrate SUB may be a transparent plate or film.

The substrate SUB may be a flexible substrate that can be bent, folded, rolled, or the like, but the disclosure is not limited thereto, and the substrate SUB may be a rigid substrate.

The barrier layer 110 may be disposed on the substrate SUB. The barrier layer 110 may prevent the diffusion of impurity ions, may prevent the permeation of moisture or outside air, and may perform a surface planarization function. The barrier layer 110 may include at least one of silicon oxide ($SiO_x$), silicon nitride ($SiN_x$), or silicon oxynitride ($SiO_xN_y$). However, the disclosure is not limited thereto, and the barrier layer 110 may be omitted depending on the type of the substrate SUB or process conditions.

The buffer layer 120 may be disposed on the barrier layer 110. The buffer layer 120 may include silicon nitride ($SiN_x$), silicon oxide ($SiO_x$), or silicon oxynitride ($SiO_xN_y$).

The semiconductor layer 130 may be disposed on the buffer layer 120. The semiconductor layer 130 may form a channel of a thin film transistor TR of a pixel PX (see FIG. 3). The semiconductor layer 130 may include polycrystalline silicon. However, the disclosure is not limited thereto, and the semiconductor layer 130 may include at least one of single crystal silicon, low-temperature polycrystalline silicon, amorphous silicon, and oxide semiconductor.

The first insulating layer IL1 may be disposed on the semiconductor layer 130. The first insulating layer IL1 may be a first gate insulating layer having a gate insulating function. The first insulating layer IL1 may include at least one of a silicon compound and a metal oxide.

The first gate conductive layer 140 may be disposed on the first insulating layer IL1. The first gate conductive layer 140 may include a gate electrode GAT of a thin film transistor TR of the pixel, a scan line electrically connected to the gate electrode GAT, and a first storage capacitor electrode CE1.

The first gate conductive layer 140 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), or copper (Cu).

The second insulating layer IL2 may be disposed on the first gate conductive layer 140. The second insulating layer IL2 may be an interlayer insulating layer or a second gate insulating layer. The second insulating layer IL2 may include an inorganic insulating material such as silicon oxide, silicon nitride, silicon oxynitride, hafnium oxide, aluminum oxide, titanium oxide, tantalum oxide, or zinc oxide.

The second gate conductive layer 150 may be disposed on the second insulating layer IL2. The second gate conductive layer 150 may include a second storage capacitor electrode CE2. The second gate conductive layer 150 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), or copper (Cu). The second gate conductive layer 150 and the first gate conductive layer 140 may be made of a same material or a similar material, but the disclosure is not limited thereto.

The third insulating layer IL3 may be disposed on the second gate conductive layer 150. The third insulating layer IL3 may be an interlayer insulating layer. The third insulating layer IL3 may include an inorganic insulating material such as silicon oxide, silicon nitride, silicon oxynitride, hafnium oxide, aluminum oxide, titanium oxide, tantalum oxide, or zinc oxide.

The data conductive layer 160 may be disposed on the third insulating layer IL3. The data conductive layer 160 may include a first electrode SD1, a second electrode SD2, and a first power line ELVDDE of a thin film transistor TR of a pixel. The first electrode SD1 and the second electrode SD2 of the thin film transistor TR may be electrically connected to a source region and a drain region of the semiconductor layer 130 through a contact hole penetrating the third insulating layer IL3, the second insulating layer IL2, and the first insulating layer IL1. The first power line ELVDDE may be electrically connected to the second storage capacitor electrode CE2 through a contact hole penetrating the third insulating layer IL3.

The data conductive layer 160 may include at least one metal selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), or copper (Cu). The data conductive layer 160 may be a single layer or multiple layers. For example, the data conductive layer 160 may be formed in a stacked structure of Ti/Al/Ti, Mo/Al/Mo, Mo/AlGe/Mo, or Ti/Cu.

The fourth insulating layer IL4 may be disposed on the data conductive layer 160. The fourth insulating layer IL4 may cover or overlap the data conductive layer 160. The fourth insulating layer IL4 may be a via layer. The fourth insulating layer IL4 may include an organic insulating material. In case that the fourth insulating layer IL4 may include an organic material, an upper surface thereof may be substantially flat despite a step in a lower portion thereof.

The anode electrode ANO may be disposed on the fourth insulating layer IL4. The anode electrode ANO may be a pixel electrode provided for each pixel. The anode electrode ANO may be electrically connected to the second electrode SD2 of the thin film transistor TR through a contact hole CNT penetrating the fourth insulating layer IL4.

The anode electrode ANO may have, but is not limited to, a stacked film structure in which a high-work-function layer including indium tin oxide (ITO), indium zinc oxide (IZO), zinc oxide (ZnO), or indium oxide ($In_2O_3$) and a reflective layer including silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca), or a mixture thereof are stacked each other. The high-work-function layer may be disposed above the reflective layer and be disposed closer to the light emitting layer EML. The anode electrode ANO may have a multilayer structure of ITO/Mg, ITO/MgF, ITO/Ag, or ITO/Ag/ITO, but the disclosure is not limited thereto.

The pixel defining layer PDL may be disposed on the anode electrode ANO. The pixel defining layer PDL may include an opening provided or disposed in the anode electrode ANO and exposing the anode electrode ANO. A light emitting area EMA and a non-light emitting area NEM may be defined by the pixel defining layer PDL and the opening thereof. The pixel defining layer PDL may include an organic insulating material. However, the disclosure is not limited thereto, and the pixel defining layer PDL may include an inorganic material.

The pixel defining layer PDL may be physically spaced apart from the anode electrode ANO in an area thereof overlapping the anode electrode ANO. The encapsulation or encapsulating layer ENL may be disposed in a space where the pixel defining layer PDL and the anode electrode ANO are spaced apart from each other, and the encapsulation or encapsulating layer ENL may be disposed between the pixel defining layer PDL and the anode electrode ANO. Therefore, adhesive force of the encapsulation or encapsulating layer ENL may be improved, and the reliability of the display device 1 (see FIG. 1) may be improved. A detailed description thereof will be described below.

A spacer SC may be disposed on the pixel defining layer PDL. The spacer SC may serve to maintain a gap from a structure disposed thereon. Similar to the pixel defining layer PDL, the spacer SC may include an organic insulating material.

The light emitting layer EML may be disposed on the anode electrode ANO exposed by the pixel defining layer PDL. The light emitting layer EML may include an organic layer. The organic layer of the light emitting layer may include an organic light emitting layer and may further include a hole injection or transport layer and/or an electron injection or transport layer.

The cathode electrode CAT may be disposed on the light emitting layer EML. The cathode electrode CAT may be a common electrode that is entirely disposed without distinction of pixels. The anode electrode ANO, the light emitting layer EML, and the cathode electrode CAT may constitute an organic light emitting element.

The cathode electrode CAT may include a low-work-function layer including Li, Ca, LiF/Ca, LiF/Al, Al, Mg, Ag, Pt, Pd, Ni, Au, Nd, Ir, Cr, BaF, Ba, or a compound or mixture thereof (for example, a mixture of Ag and Mg). The cathode electrode CAT may further include a transparent metal oxide layer disposed on the low-work-function layer.

The thin film encapsulation or encapsulating layer ENL including a first encapsulation film EN1, a second encapsulation film EN2, and a third encapsulation film EN3 may be disposed on the cathode electrode CAT. At an end of the encapsulation or encapsulating layer ENL, the first encapsulation film EN1 and the third encapsulation film EN3 may contact each other. The second encapsulation film EN2 may be sealed by the first encapsulation film EN1 and the third encapsulation film EN3.

Each of the first encapsulation film EN1 and the third encapsulation film EN3 may include an inorganic material. Although not limited thereto, the inorganic material may include, for example, silicon nitride, silicon oxide, or silicon oxynitride. The second encapsulation film EN2 may include an organic material. Although not limited thereto, the organic material may include, for example, an organic insulating material.

Hereinafter, a structure of the pixel defining layer PDL will be described with reference to FIGS. 5 to 8.

Figure 5:
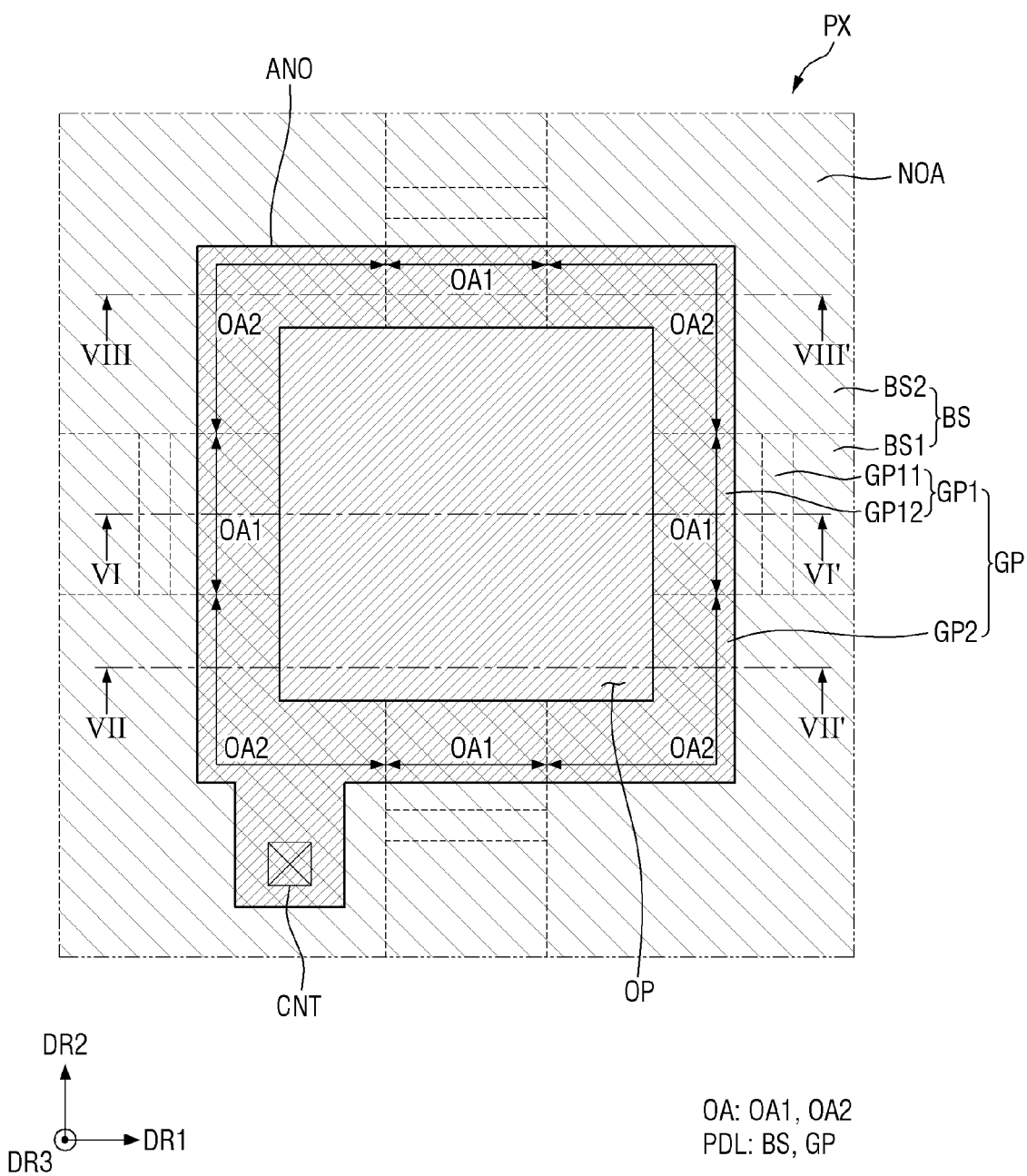
FIG. 5 is a plan view of one pixel according to an embodiment.
Figure 6:
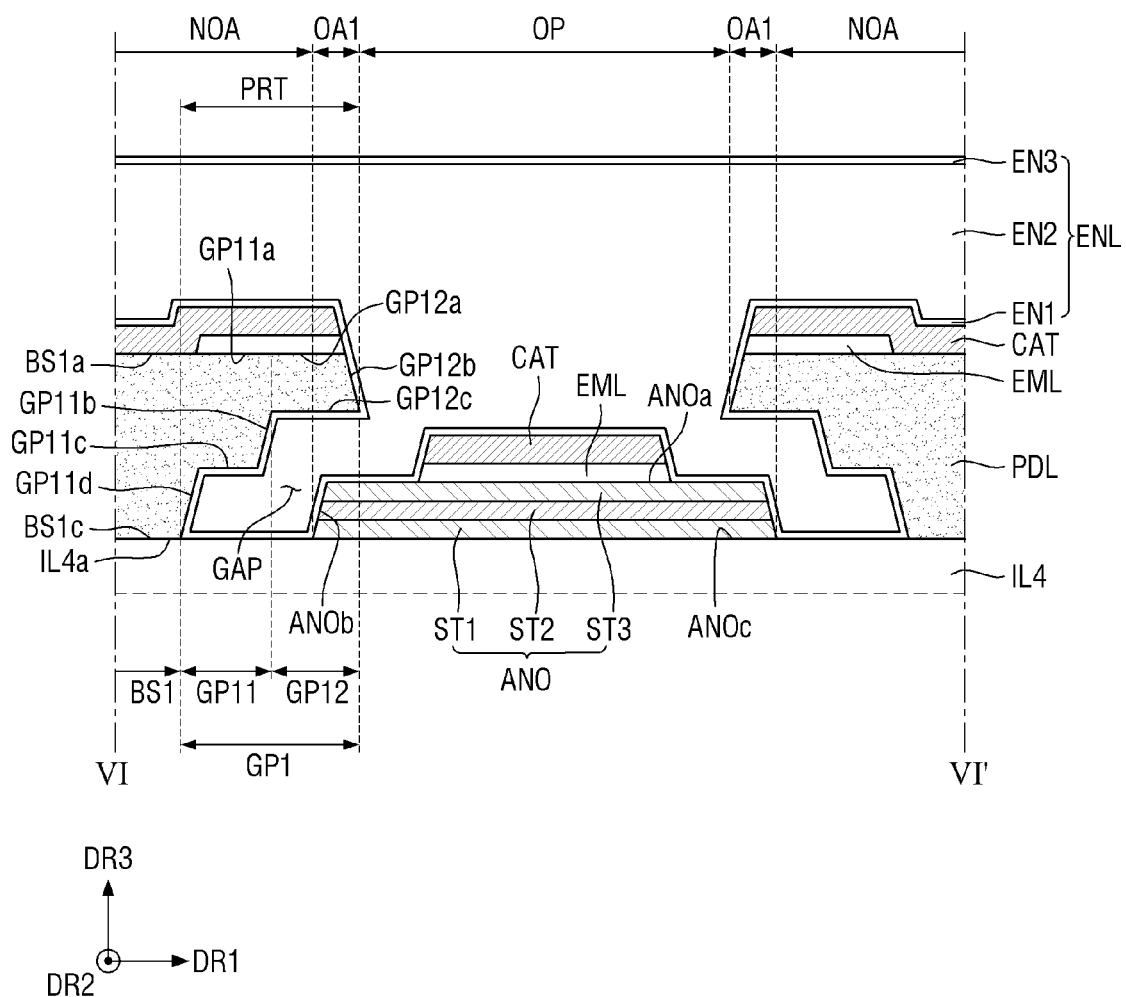
FIG. 6 is a schematic cross-sectional view taken along line VI-VI' of FIG. 5.
Figure 7:
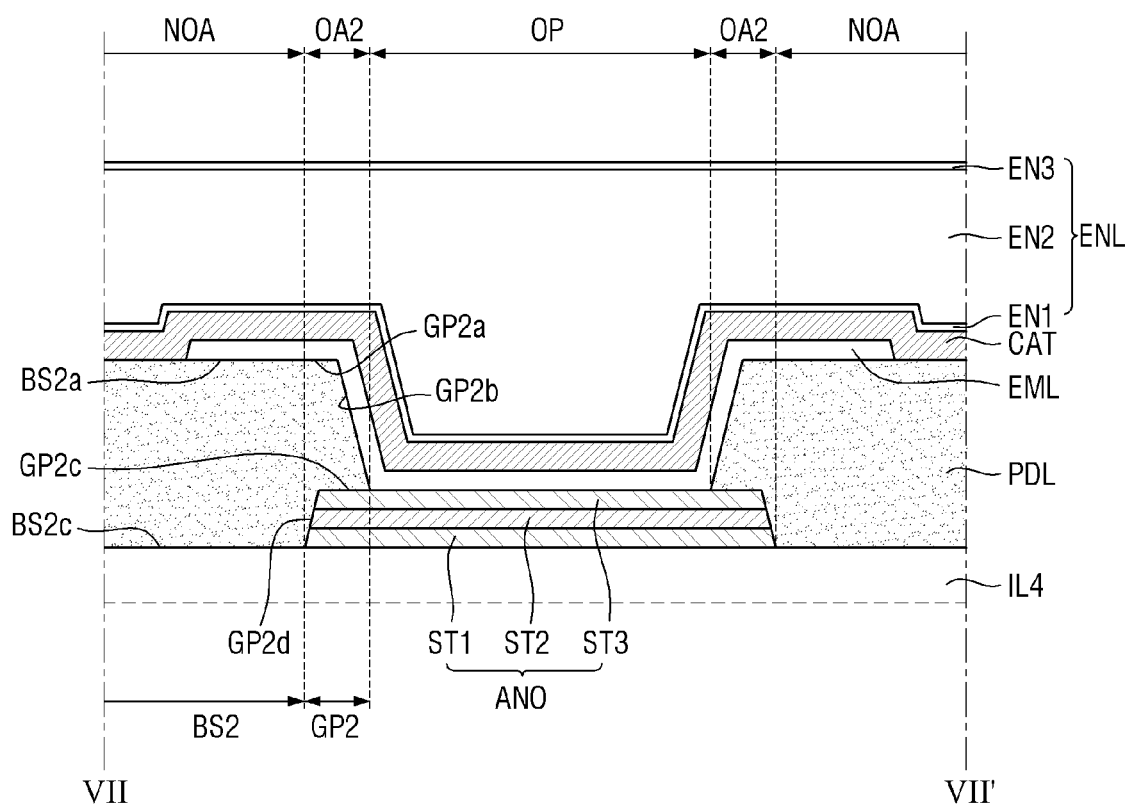
FIG. 7 is a schematic cross-sectional view taken along line VII-VII' of FIG. 5.
Figure 7:
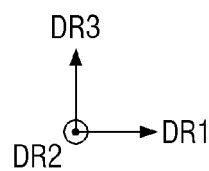
Figure 8:
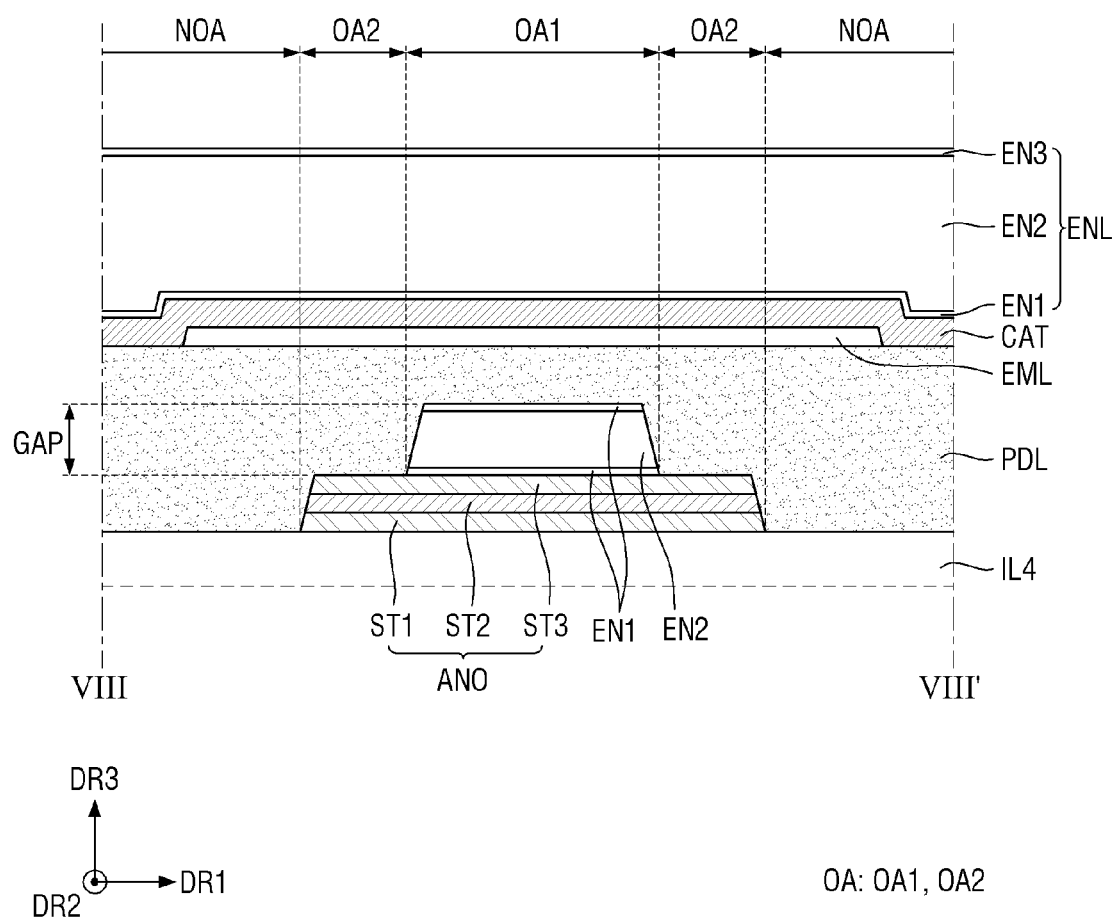
FIG. 8 is a schematic cross-sectional view taken along line VIII-VIII' of FIG. 5.

FIG. 5 is a schematic plan view of a pixel according to an embodiment. FIG. 6 is a schematic cross-sectional view taken along line VI-VI' of FIG. 5. FIG. 7 is a schematic cross-sectional view taken along line VII-VII' of FIG. 5. FIG. 8 is a schematic cross-sectional view taken along line VIII-VII' of FIG. 5. FIGS. 6 and 8 illustrate cross-sections passing through a first overlapping area OA1 of the pixel defining layer PDL according to an embodiment.

Referring to FIGS. 5 to 8, the pixel defining layer PDL may include at least an area spaced apart from and facing the anode electrode ANO. An area or a part of the encapsulation or encapsulating layer ENL may be interposed in an area (spacing area GAP in which the pixel defining layer PDL and the anode electrode ANO are spaced apart from each other and face each other.

For example, the pixel defining layer PDL may include an overlapping area OA overlapping the anode electrode ANO in a thickness direction (the third direction DR3), and a non-overlapping area NOA not overlapping the anode electrode ANO. The overlapping area OA may include a first overlapping area OA1 and a second overlapping area OA2. The first overlapping area OA1 and the second overlapping area OA2 may not overlap each other in the thickness direction (the third direction DR3). The first overlapping area OA1 and second overlapping area OA2 of the pixel defining layer PDL may be integral with each other, and the overlapping area OA and non-overlapping area NOA of the pixel defining layer PDL may be integral with each other, but the disclosure is not limited thereto.

In the first overlapping area OA1, the pixel defining layer PDL may be spaced apart from the anode electrode ANO in the thickness direction (the third direction DR3). For example, in the first overlapping area OA1, the pixel defining layer PDL may be physically spaced apart from the anode electrode ANO in the thickness direction (the third direction DR3). In the second overlapping area OA2, the pixel defining layer PDL may contact or directly contact the anode electrode ANO. For example, in the second overlapping area OA2, the pixel defining layer PDL may not be physically spaced apart from the anode electrode ANO.

The pixel defining layer PDL may further include an opening OP exposing the anode electrode ANO in a plan view. The opening OP may penetrate the pixel defining layer PDL in the thickness direction and may be defined by the pixel defining layer PDL.

Although not limited thereto, first overlapping areas OA1 and second overlapping areas OA2 may be provided, and the first overlapping areas OA1 and the second overlapping areas OA2 may be repeated along the edge of the opening OP outside the opening OP exposing the anode electrode ANO, in a plan view. For example, in a plan view, the first overlapping areas OA1 may be located or disposed at a side and another side of the opening OP in the first direction DR1 and a side and another side of the opening OP in the second direction DR2, and the second overlapping area OA2 may be located or disposed between the first overlapping areas OA1 adjacent to each other. In a plan view, the first overlapping areas OA1 and the second overlapping areas OA2 may be alternately located or disposed along the edge of the opening OP. However, the disclosure is not limited thereto, and at least one of the first overlapping area OA1 and the second overlapping area OA2 may be provided as a single overlapping area.

In the first overlapping area OA1, the encapsulation or encapsulating layer ENL may be interposed between the pixel defining layer PDL and the anode electrode ANO. In other words, in the first overlapping area OA1, the first encapsulation film EN1 and the second encapsulation film EN2 of the encapsulation or encapsulating layer ENL may be interposed between the pixel defining layer PDL and the anode electrode ANO.

The pixel defining layer PDL may include a base portion BS and a spacing portion GP. The base portion BS may be disposed in the non-overlapping area OA, and at least an area of the spacing portion GP may be disposed in the overlapping area OA. The base portion BS of the pixel defining layer PDL may contact or directly contact a layer where the pixel defining layer PDL is disposed. In a plan view, the base portion BS may surround the anode electrode ANO. The spacing portion GP of the pixel defining layer PDL may be spaced apart from the layer where the pixel defining layer PDL is disposed, in the thickness direction (the third direction DR3).

For example, in case that the pixel defining layer PDL is disposed on the fourth insulating layer IL4, the base portion BS may be disposed on the fourth insulating layer IL4 and may contact or directly contact the fourth insulating layer IL4. In case that the pixel defining layer PDL is disposed on the fourth insulating layer IL4, the spacing portion GP may be spaced apart from the fourth insulating layer IL4 in the thickness direction (the third direction DR3). Further, at least an area of the spacing portion GP may be spaced apart from the anode electrode ANO.

The base portion BS may include a first base portion BS1 and a second base portion BS2. The first base portion BS1 and the second base portion BS2 may be spaced apart from the anode electrode ANO. The first base portion BS1 and the second base portion BS2 may not overlap the anode electrode ANO. The second base portion BS2 may be disposed closer to the anode electrode ANO than to the first base portion BS1. In a plan view, the second base portion BS2 may protrude toward the anode electrode ANO than the first base portion BS1.

In a plan view, the first base portion BS1 and the anode electrode ANO may be spaced apart from each other, and in a plan view, the second base portion BS2 and the anode electrode ANO may not be spaced apart from each other. However, the disclosure is not limited thereto, and the second base portion BS2 and the anode electrode ANO may be spaced apart from each other in a plan view. In a plan view, the width between the second base portion BS2 and the anode electrode ANO may be smaller than that between the first base portion BS1 and the anode electrode ANO.

The first base portion BS1, the second base portion BS2, and the anode electrode ANO may be located or disposed on a same layer, and the first base portion BS1 and the second base portion BS2 may be spaced apart from the anode electrode ANO in a direction perpendicular to the thickness direction (the third direction DR3). For example, the first base portion BS1 and the second base portion BS2 may be disposed on the anode electrode ANO and the fourth insulating layer IL4 and may be spaced apart from each other in either of the first direction DR1 and the second direction DR2. The first base portion BS1 and the second base portion BS2 may be spaced apart from and face each other in a direction (for example, the first direction DR1) perpendicular to a surface ANOa of the anode electrode ANO and the thickness direction (the third direction DR3) or the second direction DR2.

The first base portion BS1 may include a surface BS1a and another surface BS1c that is a surface opposite to the surface BS1a. The second base portion BS2 may include a surface BS2a and another surface BS2c that is a surface opposite to the one surface BS2a. Each of the surfaces BS1a and BS2a may refer to an upper surface located or disposed at an upper side of the cross-sectional view, and each of the other surfaces BS1c and BS2c may refer to a lower surface located or disposed at a lower side of the cross-sectional view, but the disclosure is not limited thereto. Moreover, the same contents may be applied to a surface and another surface to be described below.

The spacing portion GP of the pixel defining layer PDL may protrude from the base portion BS of the pixel defining layer PDL and may be spaced apart from the fourth insulating layer IL4 in the thickness direction (the third direction DR3). In other words, the spacing portion GP may protrude from the base portion BS toward the anode electrode ANO and may be spaced apart from the fourth insulating layer IL4 in the thickness direction (the third direction DR3). The thickness of the spacing portion GP may be smaller than that of the base portion BS, but the disclosure is not limited thereto. Here, each of the thickness of the spacing portion GP and the thickness of the base portion BS may refer to an average thickness.

The spacing portion GP may include a first spacing portion GP1 and a second spacing portion GP2. The first spacing portion GP1 may protrude from the first base portion BS1, and the second spacing portion GP2 may protrude from the second base portion BS2. Although not limited thereto, first spacing portions GP1 and second spacing portions GP2 may be provided, and the first spacing portions GP1 and the second spacing portions GP2 may be repeated along the edge of the opening OP outside the opening OP exposing the anode electrode ANO. For example, the first spacing portions GP1 may be located or disposed at a side and another side of the opening OP in the first direction DR1 and at a side and another side of the opening OP in the second direction DR2, and the second spacing portion GP2 may be located or disposed between the first spacing portions GP1 adjacent to each other. The first spacing portions GP1 and the second spacing portions GP2 may be alternately located or disposed along the edge of the opening OP. However, the disclosure is not limited thereto, and at least one of the first spacing portion GP1 and the second spacing portion GP2 may be provided as a single spacing portion.

The first spacing portion GP1 may not only be spaced apart from the fourth insulating layer IL4 in the thickness direction (the third direction DR3), but may also be spaced apart from the anode electrode ANO in the thickness direction (the third direction DR3). At least a part of the first spacing portion GP1 may overlap the anode electrode ANO in the thickness direction (the third direction DR3) and may be spaced apart from the anode electrode ANO in the thickness direction (the third direction DR3). The first spacing portion GP1 and the second spacing portion GP2 may be integral with each other, but the disclosure is not limited thereto.

For example, the first spacing portion GP1 may include a first region GP11 protruding from the first base portion BS1 and a second region GP12 protruding from the first region GP11. The first region GP11 of the first spacing portion GP1 may be disposed in the non-overlapping area NOA, and at least a part of the second region GP12 of the first spacing portion GP1 may be disposed in the overlapping area OA.

The first region GP11 of the first spacing portion GP1 may protrude toward the anode electrode ANO from an upper side of the first base portion BS1. The first region GP11 of the first spacing portion GP1 may be spaced apart from the fourth insulating layer IL4 in the thickness direction (the third direction DR3). The thickness of the first region GP11 of the first spacing portion GP1 may be smaller than that of the first base portion BS1.

The first region GP11 of the first spacing portion GP1 may include a surface GP11a, another surface GP11c opposite to the surface GP11a, and a first side surface GP11b and a second side surface GP11d bent and extended from the other surface GP11c. The first side surface GP11b and the second side surface GP11d may extend in different directions. The first side surface GP11b and the second side surface GP11d may be respectively located or disposed at a side and another side of the other surface GP11c in the thickness direction (the third direction DR3). The surface GP11a of the first region GP11 of the first spacing portion GP1 may extend from the surface BS1a of the first base portion BS1. The second side surface GP11d of the first spacing portion GP1 may extend from the other surface BS1c of the first base portion BS1 and may connect the other surface BS1c of the first base portion BS1 to the other surface GP11c of the first region GP11 of the first spacing portion GP1.

The second region GP12 of the first spacing portion GP1 may protrude toward the anode electrode ANO from an upper side of the first region GP11 of the first spacing portion GP1. At least a part of the second region GP12 of the first spacing portion GP1 may overlap the anode electrode ANO in the thickness direction (the third direction DR3) and may be spaced apart from the anode electrode ANO in the thickness direction (the third direction DR3). At least a part of the second region GP12 of the first spacing portion GP1 may be disposed in the first overlapping area OA1.

The second region GP12 of the first spacing portion GP1 may include a surface GP12a, another surface GP12c opposite to the surface GP12a, and a side surface GP12b bent and extended from the surface GP12a and the other surface GP12c. The surface GP12a of the second region GP12 of the first spacing portion GP1 may extend from the surface GP11a of the first region GP11, and the other surface GP12c of the second region GP12 of the second spacing portion GP2 may extend from the first side surface GP11b of the first region GP11. The side surface GP12b of the second region GP12 may connect the surface GP12a and the other surface GP12c of the second region GP12. The surface BS1a of the first base portion BS1, the surface GP11a of the first region GP11 of the first spacing portion GP1, and the surface GP12a of the second region GP12 of the first spacing portion GP1 may be located or disposed on a same plane, but the disclosure is not limited thereto.

The display device 1 may further include a separation space. In the spacing area GAP, the pixel defining layer PDL and the anode electrode ANO may be spaced apart from each other and face each other. For example, the spacing portion GP may refer to at least one of a space in which the first spacing portion GP1 and the anode electrode ANO are spaced apart from each other and face each other and a space in which the first base portion BS1 and the anode electrode ANO are spaced apart from each other and face each other.

For example, in the spacing area GAP, the second side surface GP11d of the first region GP11 of the first spacing portion GP1 and a side surface ANOb of the anode electrode ANO may face each other, and the first side surface GP11b of the first region GP11 of the first spacing portion GP1 and the side surface ANOb of the anode electrode ANO may face each other. The other surface GP12c of the second region GP12 of the first spacing portion GP1 may face the surface ANOa of the anode electrode ANO. However, the disclosure is not limited thereto, and in the first overlapping area OA1, the other surface GP12c of the second region GP12 of the first spacing portion GP1 may face the surface ANOa of the anode electrode ANO, and in the non-overlapping area NOA, the other surface GP12c of the second region GP12 of the first spacing portion GP1 may face a surface IL4a of the fourth insulating layer IL4. In the non-overlapping area NOA, the other surface GP11c of the first region GP11 of the first spacing portion GP1 may face the surface IL4a of the fourth insulating layer IL4.

The protrusion length PRT of the first spacing portion GP1 protruding from the first base portion BS1 may be in a range of about 100 nm to about 1,000 nm or may be in a range of about 10 nm to about 5,000 nm, but is not limited thereto. In case that the protrusion length PRT of the first spacing portion GP1 is greater than about 5,000 nm, the first spacing portion GP1 may not be readily formed, or the shape of the first spacing portion GP1 may not be maintained even if the first spacing portion GP1 is formed. Further, in case that the protrusion length PRT of the first spacing portion GP1 is less than about 10 nm, the degree of improvements in the adhesion of the encapsulation or encapsulating layer ENL to be described below may not be significant.

As the first spacing portion GP1 is spaced apart from the fourth insulating layer IL4 and the anode electrode ANO in the thickness direction (the third direction DR3), the light emitting layer EML disposed on the anode electrode ANO and the light emitting layer EML disposed on the pixel defining layer PDL may be spaced apart from each other in at least some or a number of areas. In the cross-sectional view of FIG. 6, a first portion of the light emitting layer EML disposed on the anode electrode ANO and a second portion of the light emitting layer EML disposed on the first spacing portion GP1 of the pixel defining layer PDL may be discontinuously spaced from each other. However, the light emitting layer EML disposed on the anode electrode ANO may be connected or extended to the light emitting layer EML disposed on the second spacing portion GP2. The light emitting layer EML disposed on the second spacing portion GP2 may be connected or extended to the light emitting layer EML disposed on the first spacing portion GP1. For example, the light emitting layer EML disposed on the first spacing portion GP1 and the light emitting layer EML disposed on the anode electrode ANO may be spaced apart from each other, but may be connected or extended to each other by the light emitting layer EML disposed on the second spacing portion GP2.

As the first spacing portion GP1 is spaced apart from the fourth insulating layer IL4 and the anode electrode ANO in the thickness direction (the third direction DR3), the cathode electrode CAT disposed on the anode electrode ANO and the cathode electrode CAT disposed on the pixel defining layer PDL may be spaced apart from each other in at least some or a number of areas. In the cross-sectional view of FIG. 6, a first portion of the cathode electrode CAT disposed on the anode electrode ANO and a second portion of the cathode electrode CAT disposed on the first spacing portion GP1 of the pixel defining layer PDL may be discontinuously spaced from each other. However, the cathode electrode CAT disposed on the anode electrode ANO may be connected or extended to the cathode electrode CAT disposed on the second spacing portion GP2. The cathode electrode CAT disposed on the second spacing portion GP2 may be connected or extended to the cathode electrode CAT disposed on the first spacing portion GP1. For example, the cathode electrode CAT disposed on the first spacing portion GP1 and the cathode electrode CAT disposed on the anode electrode ANO may be spaced apart from each other, but may be connected or extended to each other by the cathode electrode CAT disposed on the second spacing portion GP2.

For example, even in case that the pixel defining layer PDL may include the first spacing portion GP1, the light emitting layer EML disposed on the first spacing portion GP1 may be connected or extended to the light emitting layer EML disposed on the anode electrode ANO by the light emitting layer EML disposed on the second spacing portion GP2. Further, even in case that the pixel defining layer PDL may include the first spacing portion GP1, the cathode electrode CAT disposed on the first spacing portion GP1 may be connected or extended to the cathode electrode CAT disposed on the anode electrode ANO by the cathode electrode CAT disposed on the second spacing portion GP2. Therefore, even in case that the pixel defining layer PDL may include the first spacing portion GP1, the light emitting layer EML may readily emit light.

As the first spacing portion GP1 is spaced apart from the fourth insulating layer IL4 and the anode electrode ANO in the thickness direction (the third direction DR3), the encapsulation or encapsulating layer ENL may be interposed between the first spacing portion GP1 and the fourth insulating layer IL4 and between the first spacing portion GP1 and the anode electrode ANO. For example, the first encapsulation film EN1 and the second encapsulation film EN2 of the encapsulation or encapsulating layer ENL may be interposed between the first spacing portion GP1 and the fourth insulating layer IL4 and/or between the first spacing portion GP1 and the anode electrode ANO.

The encapsulation or encapsulating layer ENL, which is interposed between the first spacing portion GP1 and the fourth insulating layer IL4 and/or between the first spacing portion GP1 and the anode electrode ANO, may contact or directly contact the surface ANOa and the side surface ANOb of the anode electrode ANO and may cover or overlap the surface ANOa and the side surface ANOb of the anode electrode ANO. Further, the encapsulation or encapsulating layer ENL may contact or directly contact the fourth insulating layer IL4 and may cover or overlap the fourth insulating layer IL4.

For example, in the spacing area GAP, the first encapsulation film EN1 may be disposed on the side surface GP12b and the other surface GP12c of the second region GP12 of the first spacing portion GP1, the first side surface GP11b and the other surface GP11c of the first region GP11 of the first spacing portion GP1, the second side surface GP11d of the first region GP11 of the first spacing portion GP1, the surface IL4a of the fourth insulating layer IL4, and the side surface ANOb and another surface ANOc of the anode electrode ANO, and the first encapsulation film EN1 may be continuously disposed thereon. Moreover, the first encapsulation film EN1 may be disposed even outside the spacing area GAP in succession with or to be continuous to the first encapsulation film EN1 disposed in the spacing area GAP. For example, the first encapsulation film EN1 may be disposed on the cathode electrode CAT in succession with or to be continuous to the first encapsulation film EN1 disposed in the spacing area GAP, and may be disposed on the light emitting layer EML disposed on the pixel defining layer PDL.

In the spacing area GAP, the first encapsulation film EN1, which is disposed on the surface of the pixel defining layer PDL (for example, the side surface GP12b and the other surface GP12c of the second region GP12 of the first spacing portion GP1 and the first side surface GP11b, the second side surface GP11d, and the other surface GP11c of the first region GP11 of the first spacing portion GP1), may be spaced apart from and face the first encapsulation film EN1 disposed on the surface of the anode electrode ANO (for example, the side surface ANOb and the other surface ANOc of the anode electrode ANO). The second encapsulation film EN2 may fill the space between the first encapsulation film EN1 disposed on the surface of the pixel defining layer PDL and the first encapsulation film EN1 disposed on the surface of the anode electrode ANO.

In case that the encapsulation or encapsulating layer ENL is interposed in the spacing area GAP, the first encapsulation film EN1, the second encapsulation film EN2, and the first encapsulation film EN1 may be sequentially stacked each other in the thickness direction (the third direction DR3) in at least a part of the spacing area GAP, in the cross-sectional views of, for example, FIGS. 6 and 8, passing through the first overlapping area OA1.

In other words, in the above cross-sectional views, in an area in which the first spacing portion GP1 and the fourth insulating layer IL4 are spaced apart from each other in the thickness direction (the third direction DR3), the first encapsulation film EN1, the second encapsulation film EN2, and the first encapsulation film EN1 may be sequentially stacked each other on the fourth insulating layer IL4, and the first spacing portion GP1 may be disposed on the first encapsulation film EN1 positioned on the second encapsulation film EN2. Further, the second encapsulation film EN2 may be disposed between the first encapsulation films EN1, and the first encapsulation films EN1 disposed on and under or below the second encapsulation film EN2 may be integral with each other.

Moreover, in the above cross-sectional views, in the first overlapping area OA1, the first encapsulation film EN1, the second encapsulation film EN2, and the first encapsulation film EN1 may be sequentially stacked each other on the anode electrode ANO, and the first spacing portion GP1 may be disposed on the first encapsulation film EN1 positioned on the second encapsulation film EN2.

Although not limited thereto, the thickness of a portion of the first encapsulation layer EN1 disposed in the spacing area GAP may be smaller than that of a portion thereof disposed outside the spacing area GAP and exposed. Here, the thickness may refer to an average thickness of each portion.

As the encapsulation or encapsulating layer ENL is disposed between the first spacing portion GP1 and the fourth insulating layer IL4 and/or between the first spacing portion GP1 and the anode electrode ANO, the adhesive force (or peeling force or stripping force) of the encapsulation or encapsulating layer ENL may be improved. For example, the adhesive force of the encapsulation or encapsulating layer ENL may be in a range of about 15 gf/inch to about 200 gf/inch, or in a range of about 20 gf/inch to about 40 gf/inch, but is not limited thereto.

Figure 9:
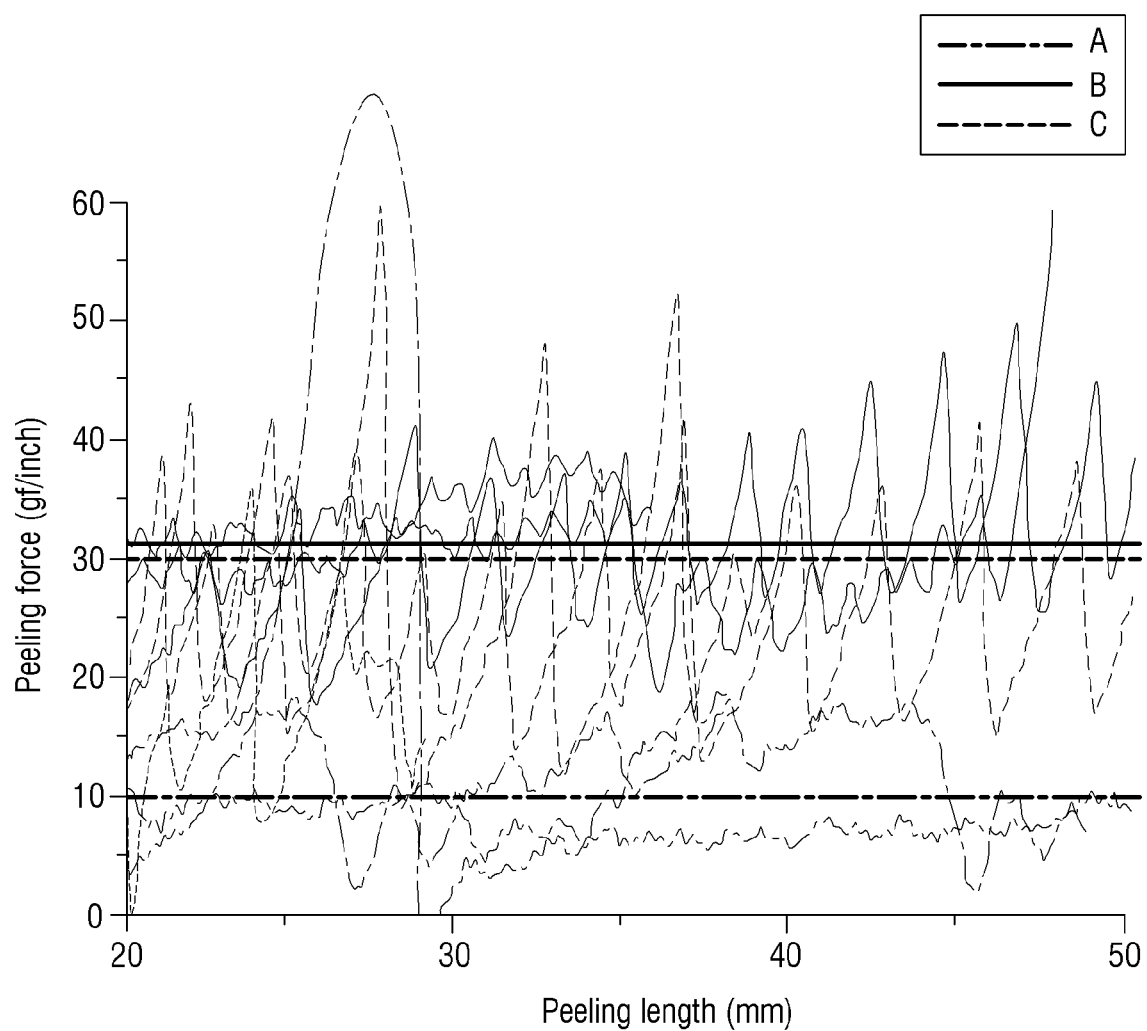
FIG. 9 is a graph illustrating the adhesion force of an encapsulation layer according to whether or not a first spacing portion is disposed according to an embodiment.

FIG. 9 is a graph illustrating the adhesive force of an encapsulation layer according to whether or not a first spacing portion is disposed according to an embodiment. As illustrated in FIG. 9, X-axis represents a peeling or stripping length (mm), and Y-axis represents an adhesive force (gf/inch). Here, the adhesive force of the encapsulation or encapsulating layer ENL may refer to an adhesive force between the encapsulation or encapsulating layer ENL and components thereunder. In other words, the adhesive force of the encapsulation or encapsulating layer ENL may refer to an adhesive force between the encapsulation or encapsulating layer ENL and components, such as the pixel defining layer PDL and the cathode electrode CAT, disposed under or below the encapsulation or encapsulating layer ENL.

Further referring to FIG. 9, graph A illustrates the adhesive force of the encapsulation or encapsulating layer ENL in case that the first spacing portion GP1 is not disposed, graph B illustrates a case where the first spacing portion GP1 is disposed and the protrusion length PRT of the first spacing portion GP1 is about 591.9 nm, and graph C illustrates a case where the first spacing portion GP1 is disposed and the protrusion length PRT of the first spacing portion GP1 is about 924.0 nm. In graphs B and C, the encapsulation or encapsulating layer ENL may be disposed between the first spacing portion GP1 and the anode electrode ANO and/or between the first spacing portion GP1 and the fourth insulating layer IL4.

It can be seen that the average adhesive force of the encapsulation or encapsulating layer ENL in graph A is about 10 gf/inch, the average adhesive force of the encapsulation or encapsulating layer ENL in graph B is about 32 gf/inch, and the average adhesive force of the encapsulation or encapsulating layer ENL in graph C is about 30 gf/inch. Therefore, it can be seen that in case that the first spacing portion GP1 is disposed (graphs B and C), the adhesive force of the encapsulation or encapsulating layer ENL is greater than that of the encapsulation or encapsulating layer ENL in case that the first spacing portion GP1 is not disposed (graph A).

Accordingly, as the pixel defining layer PDL may include the first spacing portion GP1 and the encapsulation or encapsulating layer ENL is disposed between the first spacing portion GP1 and the fourth insulating layer IL4 and/or between the first spacing portion GP1 and the anode electrode ANO, the adhesive force (or peeling force or stripping force) of the encapsulation or encapsulating layer ENL may be improved.

As the adhesive force of the encapsulation or encapsulating layer ENL is improved, the reliability of the display device 1 may be improved. For example, while the protective layer WDL of the display device 1 is attached onto the display panel 10 and a release paper having covered or overlapped the protective layer WDL is peeled or stripped therefrom, it is possible to suppress or prevent defects such as peeling or stripping of the encapsulation or encapsulating layer ENL. Further, in case that the display device 1 is a flexible display device that can be bent, folded, or rolled, even if the display device 1 is repeatedly bent, folded, or rolled, defects such as buckling and cracking that may occur in the encapsulation or encapsulating layer ENL may be suppressed or prevented. Moreover, as the first spacing portion GP1 is disposed around the anode electrode ANO, for example, around the opening OP exposing the anode electrode ANO, an additional space, such as the first spacing portion GP1, for forming a component covering or overlapping a part of an upper surface of the encapsulation or encapsulating layer ENL may not be required. Therefore, the adhesive force of the encapsulation or encapsulating layer ENL may be improved while a high-resolution structure is maintained.

Referring to FIGS. 5 to 8 again, the second spacing portion GP2 may be spaced apart from the fourth insulating layer IL4 in the thickness direction (the third direction DR3) and may overlap the anode electrode ANO in the thickness direction (the third direction DR3). The second spacing portion GP2 may contact or directly contact the anode electrode ANO. The second spacing portion GP2 may contact or directly contact an upper surface of the anode electrode ANO. At least a part of the second spacing portion GP2 may be disposed in the second overlapping area OA2.

The second spacing portion GP2 may include a surface GP2a, another surface GP2c opposite to the surface GP2a, and a first side surface GP2b and a second side surface GP2d bent and extended from the other surface GP2c. The first side surface GP2b and the second side surface GP2d may extend from the other surface GP2c in different directions. The first side surface GP2b and the second side surface GP2d may be located or disposed at a side and another side of the other surface GP2c in the thickness direction (the third direction DR3), respectively. The first side surface GP2b of the second spacing portion GP2 may connect the surface GP2a of the second spacing portion GP2 to the other surface GP2c of the second spacing portion GP2. The surface GP2a of the second spacing portion GP2 may extend from the surface BS2a of the second base portion BS2. The second side surface BS2d of the second spacing portion GP2 may extend from the other surface BS2c of the second base portion BS2. The second side surface BS2d of the second spacing portion GP2 may connect the other surface BS2c of the second base portion BS2 to the first side surface GP2b of the second spacing portion GP2. The surface BS2a of the second base portion BS2 and the surface GP2a of the second spaced portion GP2 may be located or disposed on a same plane, but the disclosure is not limited thereto.

The second spacing portion GP2 may contact or directly contact the anode electrode ANO. For example, the other surface GP2c of the second spacing portion GP2 may contact or directly contact the surface ANOa of the anode electrode ANO, and the second side surface GP2d of the second spacing portion GP2 may contact or directly contact the side surface ANOb of the anode electrode ANO. The encapsulation or encapsulating layer ENL may not be disposed between the second spacing portion GP2 and the anode electrode ANO.

The anode electrode ANO may include the surface ANOa, the other surface ANOc that is opposite to the surface ANOa, and the side surface ANOb connecting the surface ANOa to the other surface ANOc. The anode electrode ANO may include a first stacked conductive layer ST1, a second stacked conductive layer ST2, and a third stacked conductive layer ST3, which may be sequentially stacked each other. The third stacked conductive layer ST3 and the surface ANOa of the anode electrode ANO may have substantially a same surface roughness.

Although not limited thereto, the surface roughness of the surface ANOa of the anode electrode ANO (or the surface roughness of the third stacked conductive layer ST3) may in a range of greater than about 1.98 nm and less than or equal to about 5 nm, or in a range of greater than or equal to about 1.5 nm and less than or equal to about 10 nm. The surface roughness may be measured by atomic force microscopy (AFM) analysis, but the disclosure is not limited thereto. Further, a measured surface roughness value may be a root mean square (RMS) value. The RMS value is the mean of the absolute values on both sides of the center line of the surface roughness curve, which is expressed as the square root of the mean square of the values of the surface roughness curve.

The surface roughness of the surface ANOa of the anode electrode ANO may be changed during a process of forming and removing a sacrificial pattern SFP (see FIGS. 10 to 13) to be described below. For example, the surface roughness of the surface ANOa of the anode electrode ANO may increase during the process of forming and removing the sacrificial pattern SFP (see FIGS. 10 to 13). Details thereof will be described below.

Although not limited thereto, as the surface roughness of the surface ANOa of the anode electrode ANO increases, the surface roughness of the surface ANOa of the anode electrode ANO may be greater than that of the other surface ANOc of the anode electrode ANO (the surface roughness of the first stacked conductive layer ST1).

The first stacked conductive layer ST1, the second stacked conductive layer ST2, and the third stacked conductive layer ST3 may include different materials from each other. The first stacked conductive layer ST1 and the third stacked conductive layer ST3 may include amorphous indium tin oxide (ITO), and the second stacked conductive layer ST2 may include silver (Ag). Moreover, the third stacked conductive layer ST3 may further include polycrystalline ITO. In case that the third stacked conductive layer ST3 may include an amorphous ITO, a part of the third stacked conductive layer ST3 may be crystallized by the sacrificial pattern SFP (see FIGS. 10 to 13) to be described below. Details thereof will be described below.

Hereinafter, a method of manufacturing a display device according to an embodiment will be described with reference to FIGS. 10 to 16.

Figure 10:
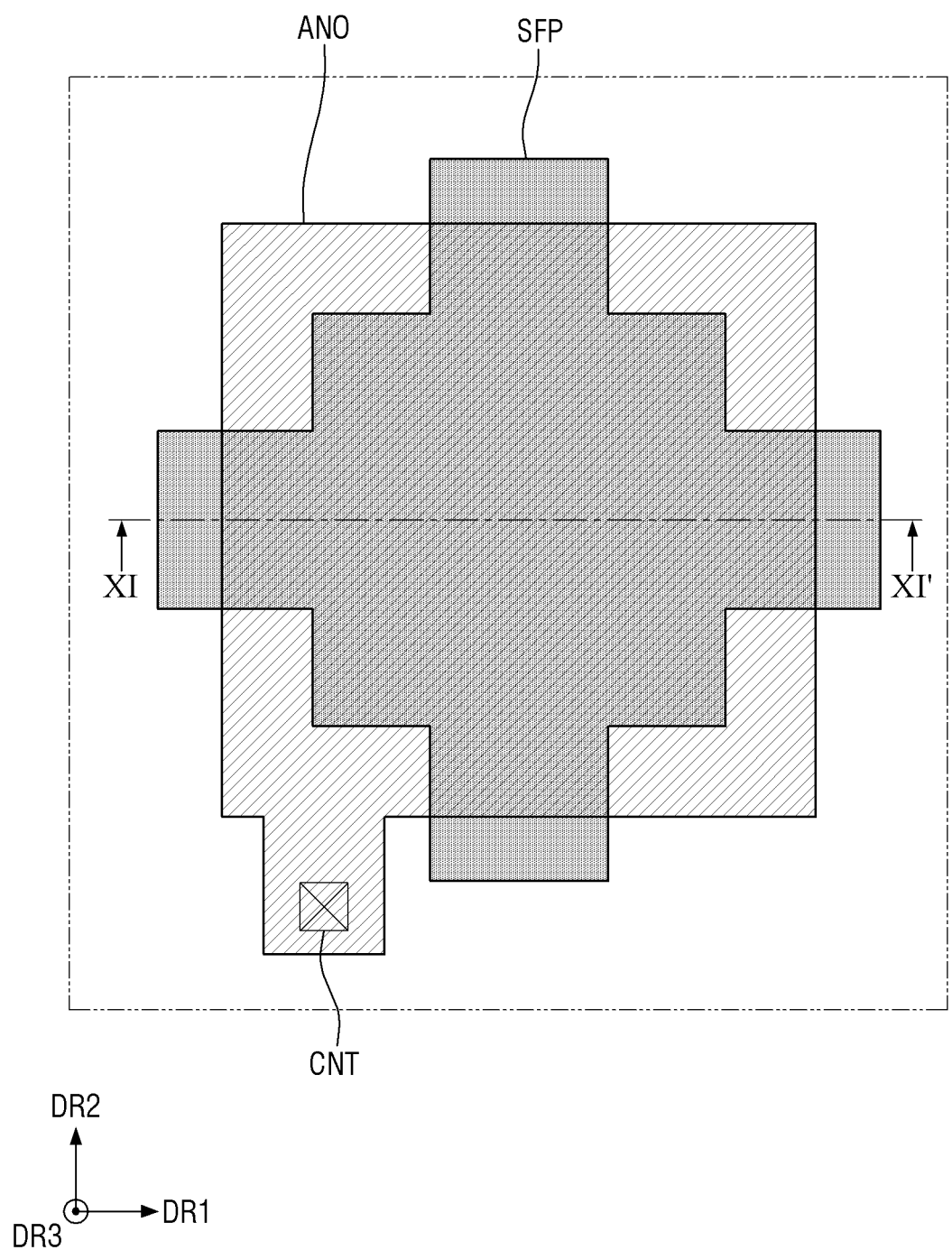
FIG. 10 is a plan view illustrating a method of manufacturing a display device according to an embodiment.
Figure 11:
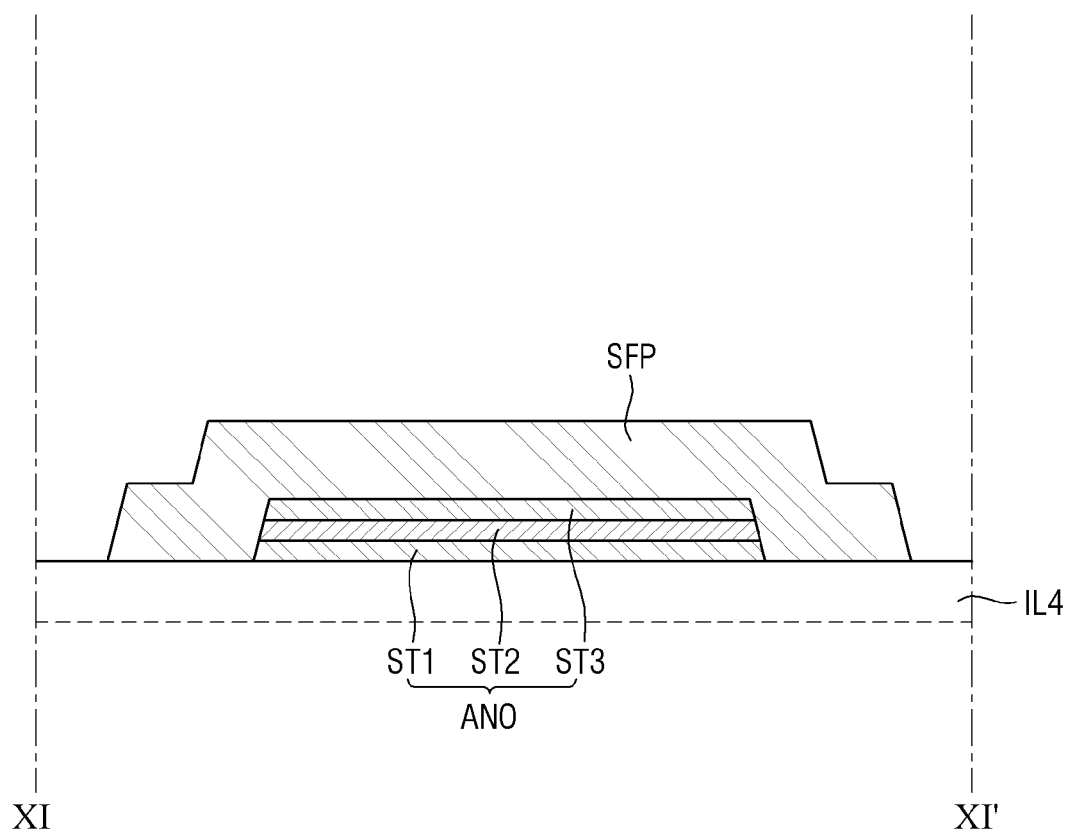
FIG. 11 is a schematic cross-sectional view taken along line XI-XI' of FIG. 10.
Figure 11:
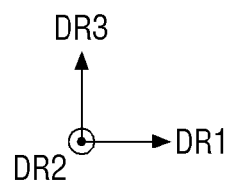

FIG. 10 is a schematic plan view illustrating a method of manufacturing a display device according to an embodiment. FIG. 11 is a schematic cross-sectional view taken along line XI-XI' of FIG. 10. FIG. 10 is a schematic enlarged view of the periphery of the anode electrode ANO of the display device 1 according to an embodiment.

First, referring to FIGS. 10 and 11, a sacrificial pattern SFP may be formed on the anode electrode ANO. For example, the anode electrode ANO may be disposed on the fourth insulating layer IL4, and the sacrificial pattern SFP may be disposed on the anode electrode ANO. The sacrificial pattern SFP may be disposed on the upper surface and side surfaces of the anode electrode ANO and may cover or overlap the upper surface and the side surfaces thereof. The sacrificial pattern SFP may be disposed on a part of the upper surface of the anode electrode ANO and a part of the side surface thereof, and may cover or overlap a part of the upper surface thereof and parts of the side surfaces thereof. Moreover, the sacrificial pattern SFP may contact or directly contact the fourth insulating layer IL4 on which the anode electrode ANO is disposed.

Although not limited thereto, the sacrificial pattern SFP may not be disposed in an area in which the second base portion BS2 (see FIG. 5) and the second spacing portion GP2 (see FIG. 5) are formed. Therefore, the second base portion BS2 (see FIG. 5) and the second spacing portion GP2 (see FIG. 5) may contact or directly contact the anode electrode ANO.

The sacrificial pattern SFP may include indium zinc oxide (IZO), but the material thereof is not limited thereto. The sacrificial pattern SFP may be formed by covering or overlapping the anode electrode ANO with a layer for a sacrificial pattern to form the layer for a sacrificial pattern on the entire area of the fourth insulating layer IL4 and pattering the layer for a sacrificial pattern.

In case that the sacrificial pattern SFP may include IZO and the third stacked conductive layer ST3 of the anode electrode ANO may include amorphous ITO, as the sacrificial pattern SFP is formed on the anode electrode ANO, the amorphous ITO of the third stacked conductive layer ST3 may be crystallized by the IZO of the sacrificial pattern SFP. Therefore, the third stacked conductive layer ST3 may include amorphous ITO and polycrystalline ITO. However, the disclosure is not limited thereto, and in case that the entire area of the third stacked conductive layer ST3 is crystallized, the third stacked conductive layer ST3 may contain polycrystalline ITO and may contain no amorphous ITO.

Figure 12:
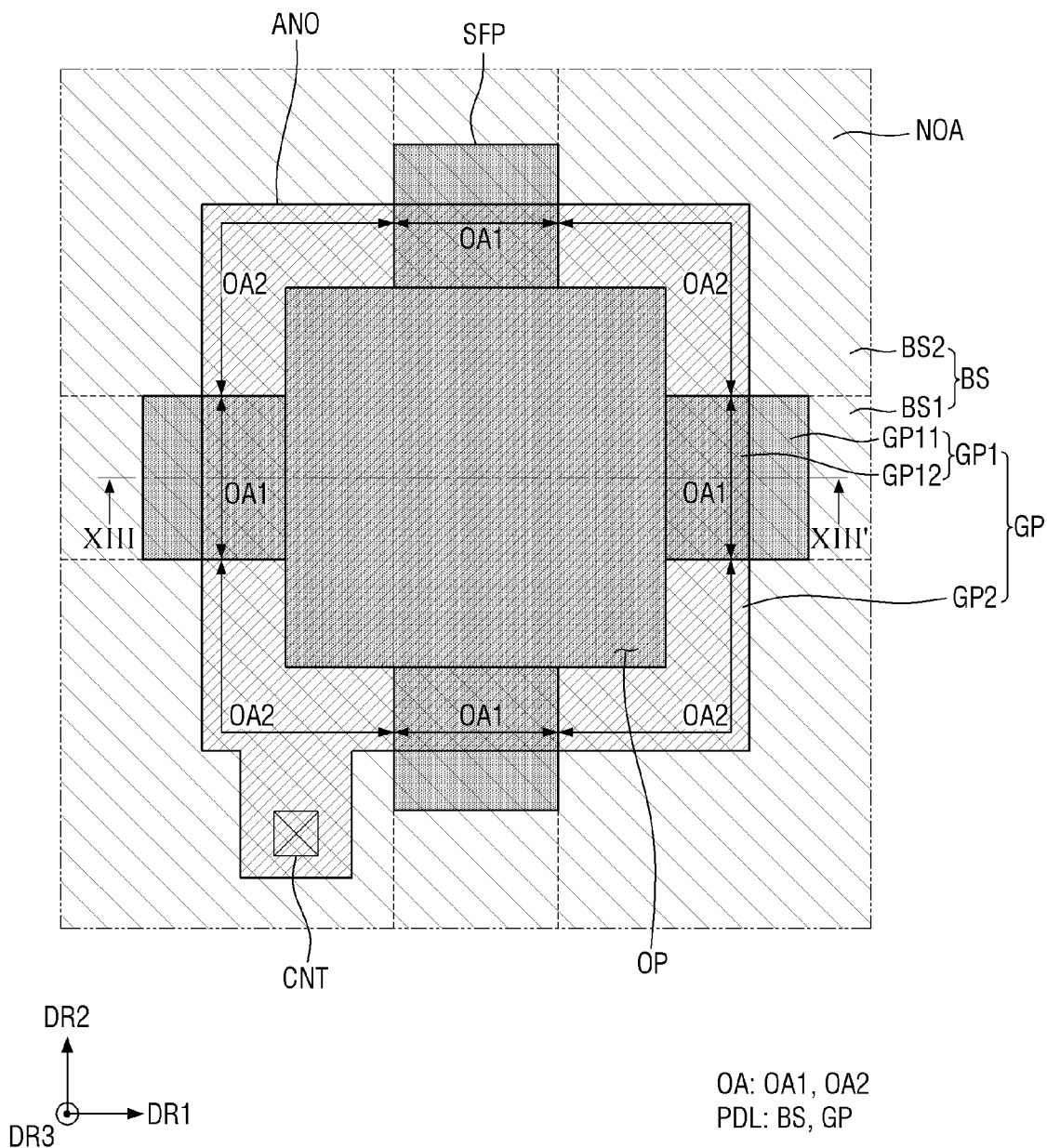
FIG. 12 is a plan view illustrating a method of manufacturing a display device according to an embodiment.
Figure 13:
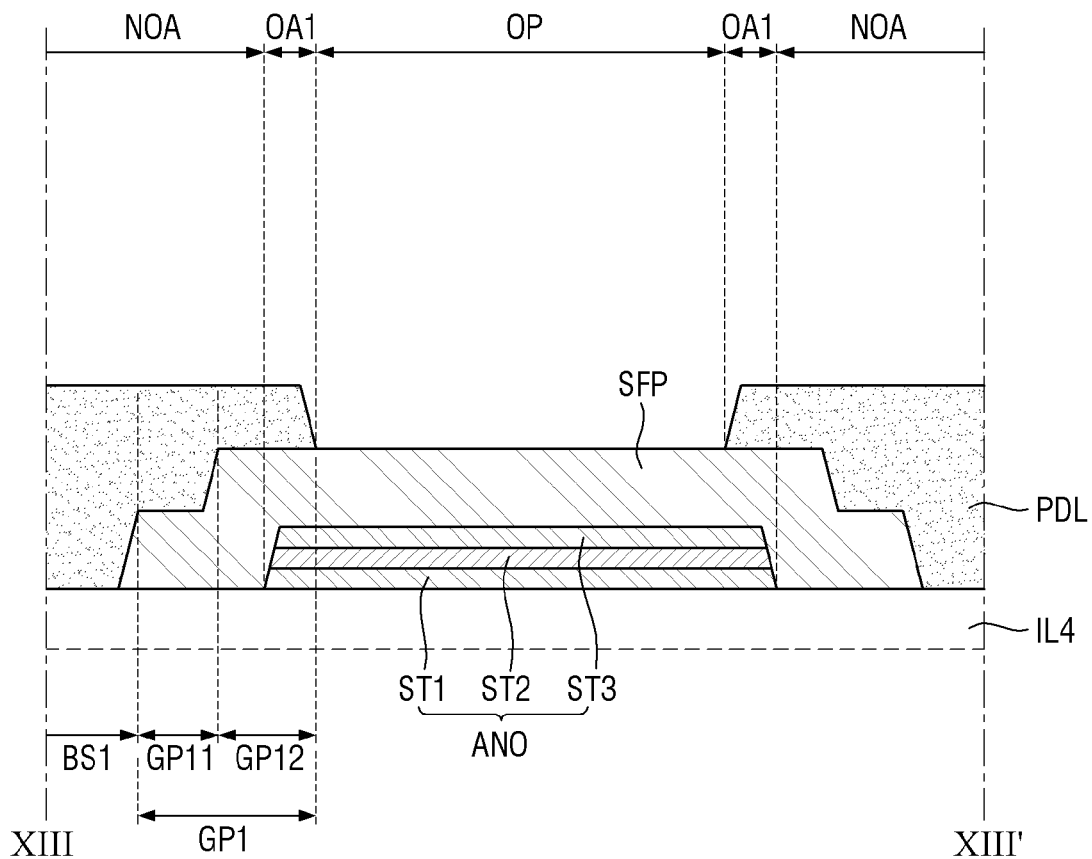
FIG. 13 is a schematic cross-sectional view taken along line XIII-XIII' of FIG. 12.

FIG. 12 is a schematic plan view illustrating a method of manufacturing a display device according to an embodiment. FIG. 13 is a schematic cross-sectional view taken along line XIII-XIII' of FIG. 12. FIG. 12 is a schematic enlarged view of the periphery of the anode electrode ANO of the display device 1 according to an embodiment.

Referring to FIGS. 12 and 13, a pixel defining layer PDL may be disposed on the fourth insulating layer IL4 to cover or overlap the anode electrode ANO and the sacrificial pattern SFP.

For example, the pixel defining layer PDL may cover or overlap the anode electrode ANO and the sacrificial pattern SFP and may be disposed on the entire area of the fourth insulating layer IL4. The pixel defining layer PDL may include an opening OP exposing the sacrificial pattern SFP. The sacrificial pattern SFP exposed by the opening OP may overlap the anode electrode ANO thereunder in the thickness direction (the third direction DR3). Although will be described below, the sacrificial pattern SFP may be removed, and the opening OP of the pixel defining layer PDL may expose the anode electrode ANO.

The pixel defining layer PDL formed on the sacrificial pattern SFP may be conformally formed on the sacrificial pattern SFP to reflect a step of the sacrificial pattern SFP thereunder. Therefore, a base portion BS including a first base portion BS1 and a second base portion BS2 and a spacing portion GP including a first spacing portion GP1 and a second spacing portion GP2 may be formed. Further, the pixel defining layer PDL and the anode electrode ANO may overlap each other in the thickness direction (the third direction DR3), and an overlapping area OA including a first overlapping area OA1 and a second overlapping area OA2 may be formed.

Figure 14:
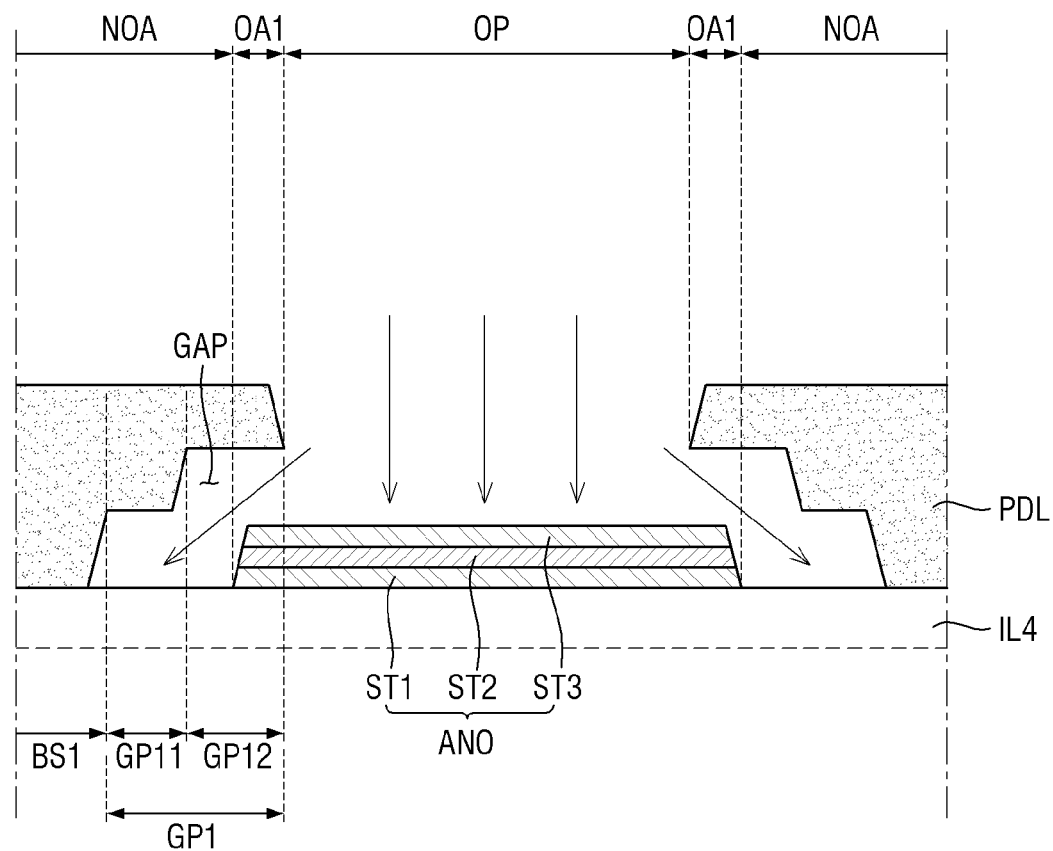
FIGS. 14 to 16 are schematic cross-sectional views illustrating a method of manufacturing a display device according to an embodiment.
Figure 15:
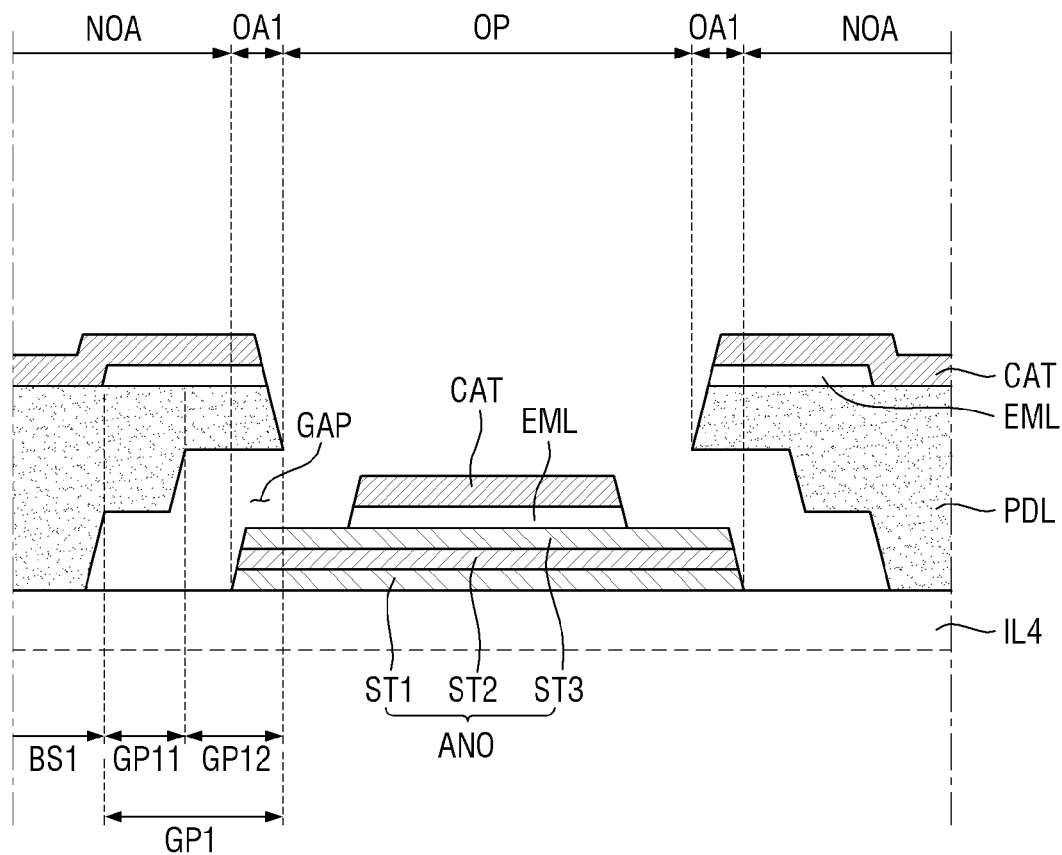
Figure 16:
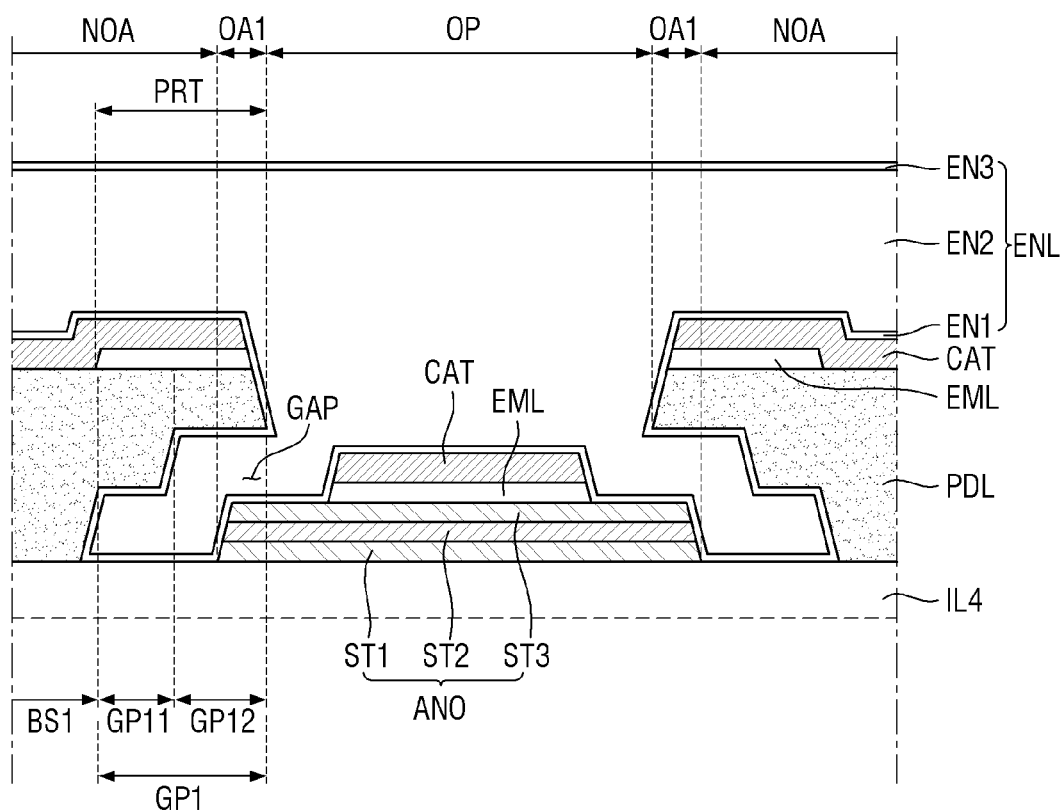

FIGS. 14 to 16 are schematic cross-sectional views illustrating a method of manufacturing a display device according to an embodiment.

Subsequently, referring to FIG. 14, the sacrifice pattern SFP may be removed. The sacrificial pattern SFP disposed between the pixel defining layer PDL and the fourth insulating layer IL4 and the sacrificial pattern SFP disposed between the pixel defining layer PDL and the anode electrode ANO as well as the sacrificial pattern SFP exposed by the opening OP of the pixel defining layer PDL may be removed together. As the sacrificial pattern SFP is removed, a spacing area GAP may be formed between the pixel defining layer PDL and the anode electrode ANO and/or between the pixel defining layer PDL and the fourth insulating layer IL4, and the opening OP of the pixel defining layer PDL may expose the anode electrode ANO.

The sacrificial pattern SFP may be removed by wet etching, but the disclosure is not limited thereto. In case that the sacrificial pattern SFP is removed by wet etching, not only the sacrificial pattern SFP exposed by the opening OP of the pixel defining layer PDL, but also the sacrificial pattern SFP covered or overlapped by the pixel defining layer PDL may be more readily removed.

In the process of forming and removing the sacrificial pattern SFP, the surface roughness of the exposed upper surface of the anode electrode ANO may increase. Although not limited thereto, a chemical reaction occurs between the sacrificial pattern SFP disposed on the anode electrode ANO and the upper surface of the anode electrode ANO, or a chemical reaction occurs with an etchant for removing the sacrificial pattern SFP, and thus, the surface roughness of the upper surface of the anode electrode ANO may increase. By way of example, a part of the upper surface of the anode electrode ANO may be etched by an etchant for removing the sacrificial pattern SFP, and thus the surface roughness of the upper surface of the anode electrode ANO may increase.

Subsequently, referring to FIG. 15, a light emitting layer EML and a cathode electrode CAT may be formed.

For example, the light emitting layer EML may be disposed on the anode electrode ANO. The light emitting layer EML may be disposed on the anode electrode ANO exposed by the opening OP of the pixel defining layer PDL. The light emitting layer EML may be disposed on the pixel defining layer PDL as well as the anode electrode ANO. The anode electrode ANO and the first spacing portion GP1 may be spaced apart from each other in the thickness direction (the third direction DR3), and thus, the light emitting layer EML disposed on the first spacing portion GP1 and the light emitting layer EML disposed on the anode electrode ANO may be spaced apart from each other in at least some or a number of areas. For example, may be located or disposed between the light emitting layer EML disposed on the first spacing portion GP1 and the light emitting layer EML disposed on the anode electrode ANO.

The cathode electrode CAT may cover or overlap the light emitting layer EML, and may be disposed on the entire area of the pixel defining layer PDL. The cathode electrode CAT disposed on the first spacing portion GP1 and the cathode electrode CAT disposed on the anode electrode ANO may be spaced apart from each other in at least some or a number of areas. For example, areas separated from each other may be located or disposed between the cathode electrode CAT disposed on the first spacing portion GP1 and the cathode electrode CAT disposed on the anode electrode ANO.

Subsequently, referring to FIG. 16, an encapsulation or encapsulating layer ENL may be formed on the cathode electrode CAT.

For example, the encapsulation or encapsulating layer ENL may be formed on the entire area of the cathode electrode CAT. The encapsulation or encapsulating layer ENL may be interposed between the first spacing portion GP1 and the anode electrode ANO and/or between the first spacing portion GP1 and the fourth insulating layer IL4. In case that the encapsulation or encapsulating layer ENL is interposed between the first spacing portion GP1 and the fourth insulating layer IL4, the encapsulation or encapsulating layer ENL may contact or directly contact the fourth insulating layer IL4.

A first encapsulation film EN1 of the encapsulation or encapsulating layer ENL may be disposed on the upper surface and the side surfaces of the cathode electrode CAT. The first encapsulation film EN1 may be disposed on the side surface GP12b of the second region GP12 of the first spacing portion GP1, the other surface GP12c of the second region GP12 of the first spacing portion GP1, the first side surface GP11b of the first region GP11 of the first spacing portion GP1, the other surface GP11c of the first region GP11 of the first spacing portion GP1, the second side surface GP11d of the first region GP11 of the first spacing portion GP1, the surface ANOa of the anode electrode ANO, the side surface ANOb of the anode electrode ANO, and the upper surface of the fourth insulating layer IL4.

A second encapsulation film EN2 may be disposed on the first encapsulation film EN1. Therefore, the first encapsulation film EN1 may be disposed on and under or below the second encapsulation film EN2 between the first spacing portion GP1 and the anode electrode ANO and/or between the first spacing portion GP1 and the fourth insulating layer IL4. In other words, the second encapsulation film EN2 may be disposed between the first encapsulation films EN1 in the thickness direction (the third direction DR3) between the first spacing portion GP1 and the anode electrode ANO and/or between the first spacing portion GP1 and the fourth insulating layer IL4.

As the sacrificial pattern SFP is formed, the pixel defining layer PDL may be formed on the sacrificial pattern SFP, and the sacrificial pattern SFP may be removed, the pixel defining layer PDL and at least one of the anode electrode ANO and the fourth insulating layer IL4 may be spaced apart from each other in the thickness direction (the third direction DR3). An encapsulation or encapsulating layer ENL may be formed in the separation space, and thus, the adhesive force of the encapsulation or encapsulating layer ENL to the components thereunder may be improved.

Hereinafter, other embodiments of the display device will be described. In the following embodiments, descriptions of components identical to those of the previously described embodiments will be omitted or simplified, and differences therebetween will be described.

Figure 17:
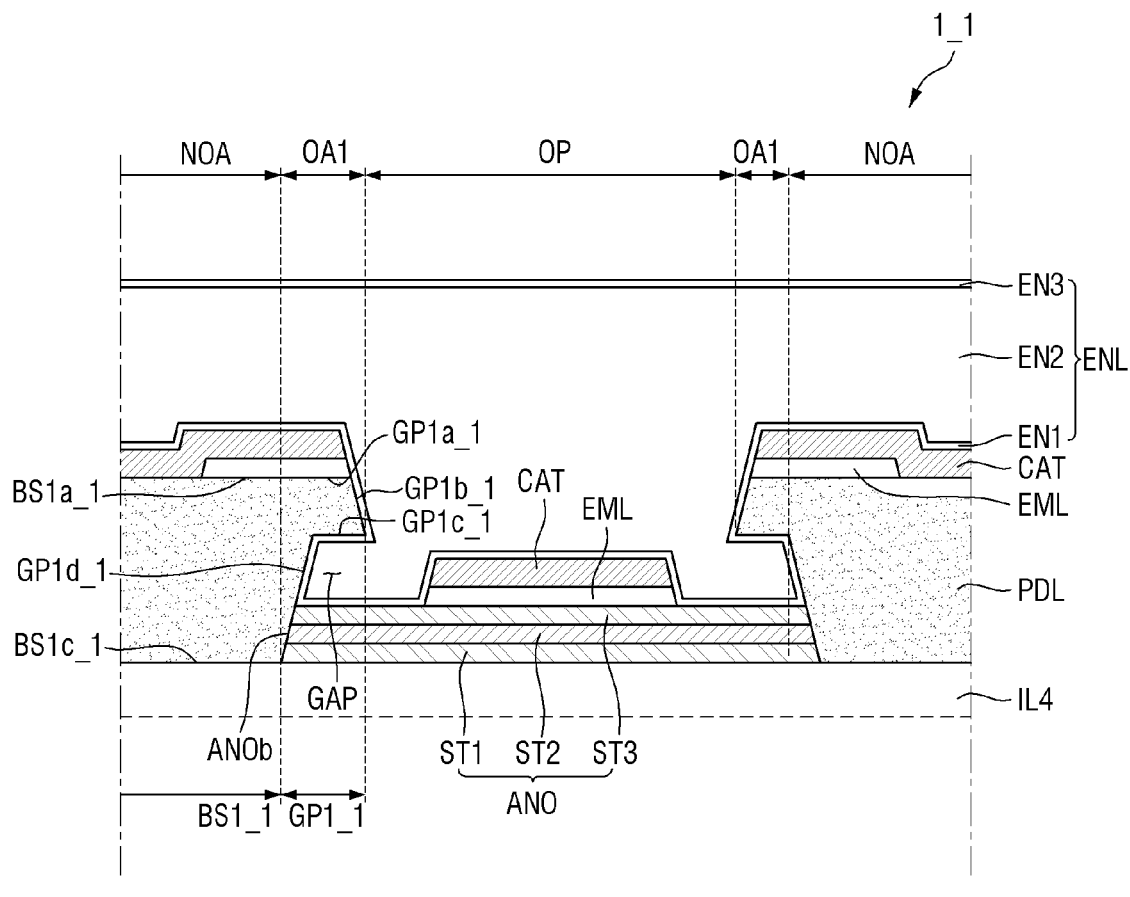
FIG. 17 is a schematic cross-sectional view of a display device according to another embodiment.

FIG. 17 is a schematic cross-sectional view of a display device according to an embodiment. FIG. 17 is a schematic cross-sectional view around an anode electrode ANO of a display device 1_1 according to an embodiment.

Referring to FIG. 17, the display device 1_1 according to an embodiment may be different from the display device 1 of an embodiment of FIG. 6 in that a first base portion BS1_1 of the pixel defining layer PDL of the display device 1_1 contacts or directly contacts the anode electrode ANO. The first base portion BS1_1 may include opposite surfaces BS1c_1 and BS1a_1.

For example, a first spacing portion GP1_1 according to the embodiment may contact or directly contact the side surface ANOb of the anode electrode ANO. The first spacing portion GP1_1 may include a surface GP1a_1, another surface GP1c_1 opposite to the surface GP1a_1, and a first side surface GP1b_1 and a second side surface GP1d_1 bent and extended from the other surface GP1c_1. The second side surface GP1d_1 of the first spacing portion GP1_1 may contact or directly contact the side surface ANOb of the anode electrode ANO.

The first spacing portion GP1_1 may protrude toward the anode electrode ANO from the first base portion BS1_1. The first spacing portion GP1_1 may overlap the anode electrode ANO in the thickness direction (the third direction DR3) and may be spaced apart from the anode electrode ANO in the thickness direction (the third direction DR3). A first overlapping area OA1 may be located or disposed in the area where the first spacing portion GP1_1 overlaps the anode electrode ANO.

In the first overlapping area OA1, an encapsulation or encapsulating layer ENL may be disposed between the first spacing portion GP1_1 and the anode electrode ANO. A first encapsulation film EN1 and a second encapsulation film EN2 of the encapsulation or encapsulating layer ENL may be disposed between the first spacing portion GP1_1 and the anode electrode ANO.

Even in this case, the encapsulation or encapsulating layer ENL may be disposed between the first spacing portion GP1_1 and the anode electrode ANO, and the adhesive force of the encapsulation or encapsulating layer ENL may be improved, so that the reliability of the display device 1_1 may be improved. Moreover, as the first base portion BS1_1 contacts or directly contacts the anode electrode ANO and the first spacing portion GP1_1 protrudes from the first base portion BS1_1, the first spacing portion GP1_1 may be formed more readily.

Figure 18:
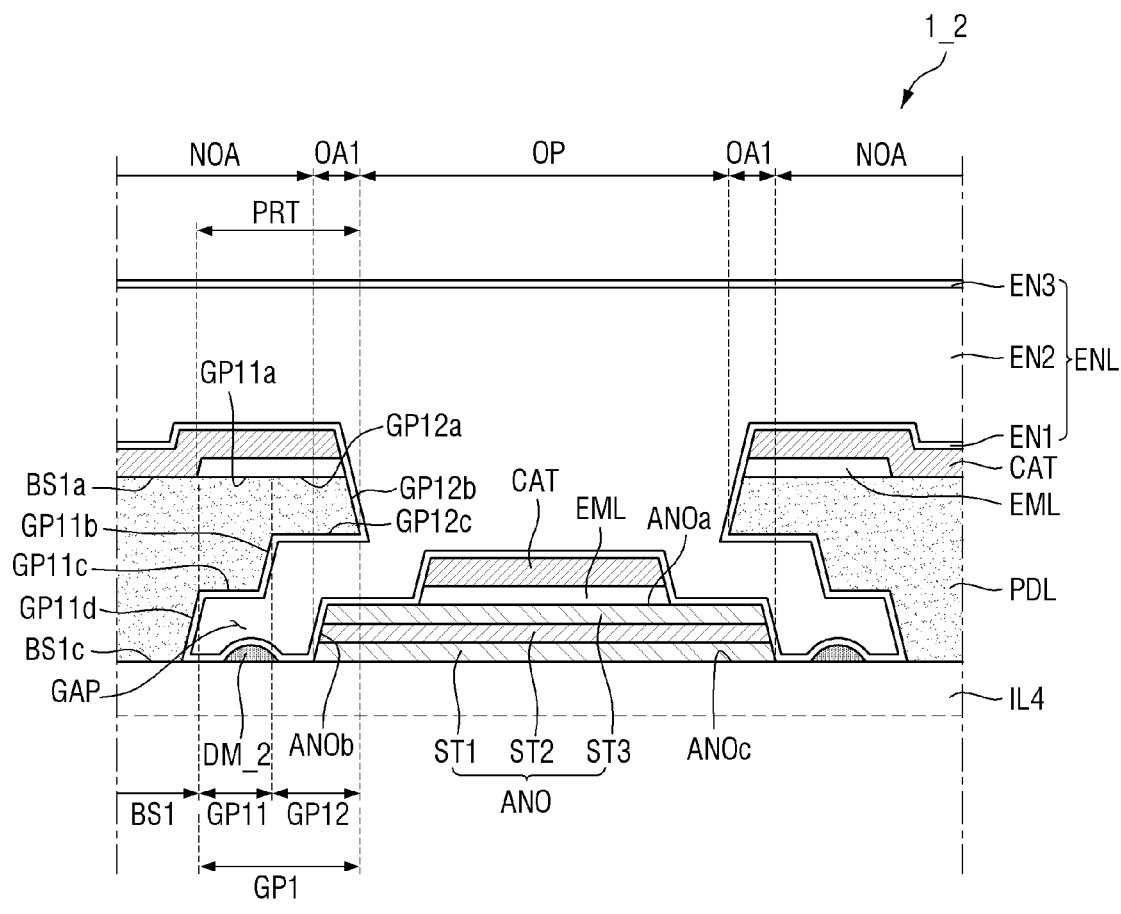
FIG. 18 is a schematic cross-sectional view of a display device according to an embodiment.

FIG. 18 is a schematic cross-sectional view of a display device according to an embodiment. FIG. 18 is a schematic cross-sectional view around an anode electrode ANO of a display device 1_2 according to an embodiment.

Referring to FIG. 18, the display device 1_2 according to an embodiment may be different from the display device 1 of an embodiment of FIG. 6 in that the display device 1_2 further includes a dummy pattern DM_2. The dummy pattern DM_2 may overlap the first spacing portion GP1 in the thickness direction (the third direction DR3). The dummy pattern DM_2 may be disposed between the first spacing portion GP1 and the fourth insulating layer IL4. The dummy pattern DM_2 may be disposed on the fourth insulating layer IL4. The dummy pattern DM_2 and the sacrificial pattern SFP (see FIGS. 10 to 13) may include a same material or a similar material. In case that the sacrificial pattern SFP (see FIGS. 10 to 13) may include IZO, the dummy pattern DM_2 may include IZO. The dummy pattern DM_2 may be a residue remaining in the process of etching the sacrificial pattern SFP (see FIGS. 10 to 13).

FIG. 18 illustrates that the dummy pattern DM_2 is disposed on the fourth insulating layer IL4 and overlaps the first region GP11 of the first spacing portion GP1, but the disclosure is not limited thereto. For example, the dummy pattern DM_2 may be disposed on the anode electrode ANO and may overlap the second region GP12 of the first spacing portion GP1.

Even in this case, an encapsulation or encapsulating layer ENL may be disposed between the first spacing portion GP1 and the anode electrode ANO and between the first spacing portion GP1 and the fourth insulating layer IL4, and the adhesive force of the encapsulation or encapsulating layer ENL may be improved, so that the reliability of the display device 1_2 may be improved. Moreover, even if the sacrificial pattern SFP (see FIGS. 10 to 13) is not completely removed, the adhesive force of the encapsulation or encapsulating layer ENL may be improved.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device, comprising:
   a first electrode disposed on a substrate;
   a pixel defining layer exposing at least a part of the first electrode and disposed on the substrate;
   a light emitting layer disposed on the first electrode;
   a second electrode disposed on the light emitting layer; and
   an encapsulation layer disposed on the second electrode, wherein
   the pixel defining layer includes an overlapping area overlapping the first electrode and a non-overlapping area not overlapping the first electrode,
   the overlapping area includes a first overlapping area, the first overlapping area is spaced apart from the first electrode thereby forming a space, and the encapsulation layer is at least partially disposed in the space located between the first electrode and the pixel defining layer in the first overlapping area.

2. The display device of claim 1, wherein the overlapping area further includes a second overlapping area contacting the first electrode.

3. The display device of claim 2, wherein the first overlapping area and the second overlapping area are alternately disposed near an edge of the first electrode in a plan view.

4. The display device of claim 3, wherein
the first overlapping area and the second overlapping area are integral with each other, and
the overlapping area and the non-overlapping area are integral with each other.

5. The display device of claim 1, wherein
in at least a cross section passing through the first overlapping area, the second electrode includes:
a first portion disposed on the pixel defining layer; and
a second portion disposed on the first electrode, and
the first portion is discontinuously spaced apart from the second portion.

6. The display device of claim 1, wherein
the encapsulation layer includes a first encapsulation film and a second encapsulation film disposed on the first encapsulation film, and
in at least a cross section passing through the first overlapping area, the first encapsulation film is continuously disposed along surfaces of the pixel defining layer and the first electrode exposed to the space between the first electrode and the pixel defining layer in the first overlapping area.

7. The display device of claim 6, wherein
in the cross section passing through the first overlapping area, the first encapsulation film disposed on the surface of the pixel defining layer and the first encapsulation film disposed on the surface of the first electrode are spaced apart from each other and face each other, and
the second encapsulation film fills a space between the first encapsulation film disposed on the surface of the pixel defining layer and the first encapsulation film disposed on the surface of the first electrode.

8. The display device of claim 7, wherein
the first encapsulation film is an inorganic film, and
the second encapsulation film is an organic film.

9. The display device of claim 1, further comprising:
a planarization layer disposed on the substrate and including the pixel defining layer and the first electrode,
wherein the pixel defining layer and the planarization layer are spaced apart from each other in a space located in the non-overlapping area at a side of the first overlapping area.

10. The display device of claim 9, wherein the encapsulation layer is at least partially disposed in the space located in the non-overlapping area at the side of the first overlapping area.

11. The display device of claim 10, wherein the encapsulation layer directly contacts the planarization layer.

12. The display device of claim 1, wherein the encapsulation layer has a peeling force in a range of about 20 gf/inch to about 40 gf/inch.

13. The display device of claim 1, wherein an upper surface of the first electrode has surface roughness in a range of more than about 1.98 nm and about 5 nm or less.

14. The display device of claim 13, wherein the surface roughness of the upper surface of the first electrode is measured by atomic force microscopy.

15. The display device of claim 1, wherein
the first electrode includes a first stacked conductive layer, a second stacked conductive layer, and a third stacked conductive layer, which are sequentially stacked,
the first stacked conductive layer and the third stacked conductive layer include amorphous Indium-Tin-Oxide (ITO),
the second stacked conductive layer includes silver (Ag), and
the third stacked conductive layer further includes poly crystal Indium-Tin-Oxide (ITO).

16. A display device, comprising:
a first electrode disposed on a substrate;
a pixel defining layer exposing the first electrode and including:
a base portion disposed on the substrate and surrounding the first electrode; and
a spacing portion forming a space between at least a portion of the first electrode and at least a portion of the pixel defining layer, the spacing portion protruding toward the first electrode from the base portion and spaced apart from and facing the first electrode;
a light emitting layer disposed on the first electrode;
a second electrode disposed on the light emitting layer; and
an encapsulation layer disposed on the second electrode,
wherein the encapsulation layer is at least partially disposed in the space of the spacing portion located between the first electrode and the pixel defining layer.

17. The display device of claim 16, wherein
the spacing portion of the pixel defining layer includes a first spacing portion and a second spacing portion,
the first spacing portion is spaced apart from the first electrode in a thickness direction, and
the second spacing portion directly contacts the first electrode.

18. The display device of claim 17, wherein the encapsulation layer is disposed between the first spacing portion and the first electrode and is not disposed between the second spacing portion and the first electrode in the thickness direction.

19. The display device of claim 18, wherein thickness of the first spacing portion and thickness of the second spacing portion are less than a thickness of the base portion.

20. The display device of claim 19, wherein an upper surface of the first spacing portion and an upper surface of the first base portion are coplanar.

21. A method of manufacturing a display device, the method comprising:
forming a first electrode on a substrate;
forming a sacrificial pattern on the first electrode;
forming a pixel defining layer on the sacrificial pattern;
removing the sacrificial pattern; and
forming an encapsulation layer on the pixel defining layer, wherein
the pixel defining layer includes an overlapping area overlapping the first electrode and a non-overlapping area not overlapping the first electrode,
the overlapping area includes a first overlapping area, the first overlapping area is spaced apart from the first electrode, thereby forming a space, and
the encapsulation layer is at least partially disposed in the space located between the first electrode and the pixel defining layer in the first overlapping area.

22. The method of claim 21, wherein the removing of the sacrificial pattern is performed by wet etching.

23. The method of claim 21, wherein the overlapping area further includes a second overlapping area contacting the first electrode.

24. The method of claim 21, wherein a surface roughness of an upper surface of the first electrode is measured by atomic force microscopy.

25. The display device of claim 1, wherein
the encapsulation layer includes a first encapsulation film continuously disposed along surfaces of the pixel defining layer.

26. The display device of claim 25, further comprising
a second encapsulation film disposed on the first encapsulation film.

\* \* \* \* \*